(12) United States Patent
Shannon et al.

(10) Patent No.: US 8,018,164 B2
(45) Date of Patent: *Sep. 13, 2011

(54) PLASMA REACTOR WITH HIGH SPEED PLASMA LOAD IMPEDANCE TUNING BY MODULATION OF DIFFERENT UNMATCHED FREQUENCY SOURCES

(75) Inventors: Steven C. Shannon, Raleigh, NC (US); Kartik Ramaswamy, San Jose, CA (US); Daniel J. Hoffman, Saratoga, CA (US); Matthew L. Miller, Fremont, CA (US); Kenneth S. Collins, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 609 days.

This patent is subject to a terminal disclaimer.

(21) Appl. No.: 12/129,155

(22) Filed: May 29, 2008

(65) Prior Publication Data

US 2009/0295295 A1 Dec. 3, 2009

(51) Int. Cl.
*H01J 7/24* (2006.01)
(52) U.S. Cl. ......... 315/111.21; 156/345.28; 156/345.44; 156/345.24; 156/345.2
(58) Field of Classification Search .............. 315/111.21, 315/344; 156/345.13–345, 15, 24, 345.28, 156/345.35, 345.44, 345.48; 118/723 E, 118/723 ER, 723 I; 216/67
See application file for complete search history.

(56) References Cited

U.S. PATENT DOCUMENTS

| | | | | |
|---|---|---|---|---|
| 5,314,603 A | * | 5/1994 | Sugiyama et al. | 156/345.28 |
| 5,474,648 A | * | 12/1995 | Patrick et al. | 156/345.28 |
| 5,643,364 A | | 7/1997 | Zhao et al. | 118/723 |
| 6,027,601 A | * | 2/2000 | Hanawa | 118/723 I |
| 6,472,822 B1 | | 10/2002 | Chen et al. | |
| 6,589,437 B1 | | 7/2003 | Collins | 216/68 |
| 6,677,711 B2 | * | 1/2004 | MacGearailt | 315/111.21 |
| 6,818,562 B2 | * | 11/2004 | Todorow et al. | 156/345.24 |
| 6,920,312 B1 | * | 7/2005 | Benjamin | 455/69 |
| 7,030,335 B2 | | 4/2006 | Hoffman et al. | 219/121.43 |
| 7,084,832 B2 | | 8/2006 | Pribyl | |
| 7,157,857 B2 | | 1/2007 | Brouk et al. | |
| 2006/0278609 A1 | * | 12/2006 | Hoffman | 216/67 |
| 2008/0180028 A1 | * | 7/2008 | Collins et al. | 315/111.21 |
| 2009/0159439 A1 | * | 6/2009 | Pipitone et al. | 204/298.03 |
| 2009/0294061 A1 | | 12/2009 | Shannon et al. | |
| 2009/0294062 A1 | | 12/2009 | Shannon et al. | |
| 2009/0294275 A1 | | 12/2009 | Shannon et al. | |
| 2009/0294414 A1 | | 12/2009 | Shannon et al. | |
| 2009/0295296 A1 | | 12/2009 | Shannon et al. | |
| 2009/0297404 A1 | | 12/2009 | Shannon et al. | |
| 2009/0298287 A1 | | 12/2009 | Shannon et al. | |

OTHER PUBLICATIONS

Official Action Dated Jan. 3, 2011 Issued in Co-Pending U.S. Appl. No. 12/129,244.
Official Action Dated Apr. 6, 2011 Issued in Co-Pending U.S. Appl. No. 12/129,244.
Official Action Dated Jun. 28, 2011 Issued in Co-Pending U.S. Appl. No. 12/129,024.

\* cited by examiner

*Primary Examiner* — Jacob Y Choi
*Assistant Examiner* — Ephrem Alemu
(74) *Attorney, Agent, or Firm* — Robert M. Wallace

(57) ABSTRACT

Fluctuations in a plasma characteristic such as load impedance are compensated by a controller that modulates a stabilization RF generator coupled to the plasma having a frequency suitable for stabilizing the plasma characteristic, the controller being responsive to the fluctuations in the plasma characteristic.

18 Claims, 23 Drawing Sheets

PLASMA REACTOR WITH HIGH SPEED PLASMA LOAD IMPEDANCE TUNING BY MODULATION OF DIFFERENT UNMATCHED FREQUENCY SOURCES

BACKGROUND

Plasma processes employed in semiconductor fabrication are constantly being improved in order to make smaller device feature sizes in thin film structures on semiconductor wafers. Currently, feature sizes are in the range of tens of nanometers. The ever decreasing feature sizes are difficult to realize without accurate control of delivered RF power. The amount of RF power delivered to the plasma is affected by fluctuations in plasma impedance. Such fluctuations are typically compensated by a conventional impedance match element or circuit. One problem is that impedance match elements or circuits have a significant delay in responding to plasma impedance changes. For example, a variable reactance impedance match circuit has a response delay on the order of a second, typically. A tuned frequency impedance match system has a response delay on the order of 100 msec. Random or sporadic fluctuations in plasma impedance occurring at rates faster than the impedance match response delay may cause the impedance match to fail, destroying control over delivered RF power to the plasma. Moreover, an impedance match circuit has a limited match space or range of plasma impedances over which the match is able to maintain the load impedance presented to the RF generator sufficiently close to 50Ω to maintain the voltage standing wave ratio (VSWR) at the RF generator output below a threshold above which the generator does not function.

In the presence of random fluctuations in plasma impedance with a rise time corresponding to 100 kHz, the RF impedance match circuit has difficulty following the rapid plasma impedance change, and may cease to function properly, so that it creates an impedance mis-match. Upon this occurrence, the power reflected back to the RF generator exceeds an acceptable level, and the reactor is shut down.

The inability of the impedance match circuit to follow the higher frequency transients may be attributable to its design. For impedance match circuits employing variable reactance elements, the variable reactance elements may have mechanical limitations that slow their response, and typically have response times on the order of one second. For impedance match circuits employing tuned frequency generators, the frequency tuning element of such a device may have mechanical limitations that slow their response, and typically have response times on the order of 100 milliseconds.

The action of the RF impedance match circuit in maintaining a constant impedance match for the RF generator is necessary for two reasons. First, the measurement and control of RF power delivered to the plasma must be sufficiently accurate to carry out requirements of the process recipe. Secondly, the RF generator must be protected from damage by reflected RF power (which is caused by an impedance mis-match between the RF generator output and the plasma).

SUMMARY

In a plasma reactor for processing a workpiece, plural impedance matches and plural RF plasma power generators deliver respective RF plasma powers into the reactor chamber through respective ones of the impedance matches. A first stabilization RF power generator delivers RF stabilization power of a first frequency into the chamber. A controller determines changes in load impedance from RF parameters sensed at one of the generators and resolves the changes in load impedance into different components thereof. The controller changes the output power delivered by the first stabilization RF power generator into the chamber in response to a first component of the changes in load impedance.

In one embodiment, the reactor further includes a second stabilization RF power generator operatively connected to deliver RF stabilization power of a second frequency into the chamber, and the controller changes the output power delivered by the second stabilization RF power generator into the chamber in response to a second component of the changes in load impedance. The first component may be a reactive component and the first frequency may be in an LF frequency range or below, while the second component may be a resistive component and the second frequency may be in or above an HF frequency range.

In a related embodiment, the first component may be a reactive component and the first frequency may be in an LF frequency range or below, while the second component may be a resistive component and the second frequency may be in or above an HF frequency range.

In a further embodiment, the reactor further includes first and second modulators at outputs of the first and second stabilization RF power generators, respectively, the modulators being responsive to the controller.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1A:
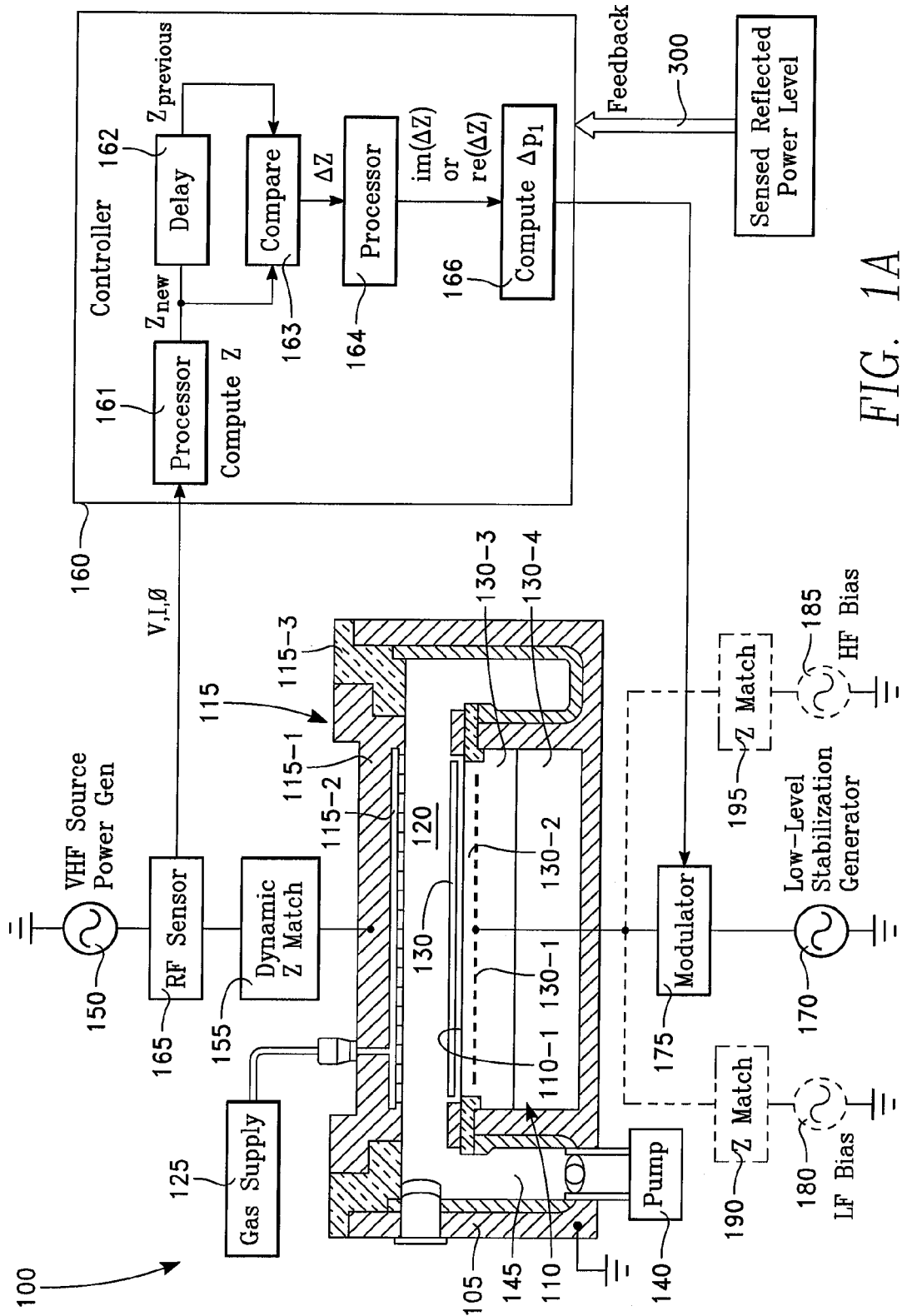
FIGS. 1A and 1B depict embodiments employing a stabilization RF power generator to stabilize the plasma impedance or oppose fluctuations in plasma impedance.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Plasma or plasma impedance is stabilized in a plasma process against random fluctuations in plasma conditions occurring without relying upon the reactor's impedance match circuits (e.g., variable reactance impedance matches or frequency tuned impedance matches). Instead, RF power of a selected frequency is applied to the plasma in response to a sensed change in plasma impedance so as to oppose sensed fluctuations in plasma impedance, thereby stabilizing the plasma impedance. RF power applied for this purpose is referred to herein as stabilization RF power. The frequency and power level of the stabilization RF power is such that it opposes the sensed change in plasma impedance. Generally, the plasma reactor has an RF plasma source power generator coupled to the reactor through an RF impedance match circuit. It may also have one or more bias power generators coupled to the wafer support through respective impedance match circuits. In some embodiments, the stabilization RF power is obtained from an auxiliary low power RF generator (one or more) coupled to the reactor without an impedance match circuit. In other embodiments, stabilization RF power is obtained from pre-existing bias power generators or the source power generator. In this case, a selected one (or ones) of the pre-existing generators are amplitude modulated as a function of plasma impedance fluctuations to obtain the desired stabilization of plasma impedance.

The selection of the frequency of the stabilization RF power may be made in accordance with the type of fluctuation in plasma impedance that is expected. For fluctuations in the imaginary component of the plasma impedance (e.g., the capacitance), the stabilization RF power frequency may be an LF or VLF frequency that strongly affects plasma sheath thickness. For fluctuations in the real component of the plasma impedance (i.e., the resistance), the stabilization RF power frequency may be a VHF frequency that strongly affects plasma electron density.

An RF plasma power generator may be coupled to an overhead electrode of the reactor chamber (if it is a source power generator) or to a wafer support electrode (if it is a bias power generator). In either case, the RF generator is coupled to the reactor through an impedance match circuit. A random fluctuation in plasma conditions may cause the plasma sheath thickness to fluctuate. Such a fluctuation in plasma sheath thickness causes the capacitive component of the plasma impedance to fluctuate. If the fluctuation is fast, the impedance match circuit for the VHF plasma source power generator cannot follow the changes in plasma impedance. The frequency of the stabilization RF power (e.g., of the auxiliary RF generator) is selected to oppose a sensed decrease in plasma sheath thickness. In one embodiment, the auxiliary RF power generator produces an LF frequency, which is ideal for increasing the plasma sheath thickness or, in the present case, opposing its decrease during an application of a high level of RF plasma source power. If such an auxiliary RF power generator is employed, then its output power is increased whenever such an impedance fluctuation is sensed. The auxiliary RF power generator may be coupled to the reactor at the wafer support or at the overhead ceiling, for example.

As another example, a random fluctuation in plasma conditions may cause the plasma electron density to fluctuate. Such a fluctuation in plasma electron density causes the resistive component of the plasma impedance to fluctuate. This fluctuation may be too fast for the impedance match circuit to follow, in which case process control may be lost. To meet this problem, the frequency of the stabilization RF power (e.g., of the auxiliary RF generator) is selected to oppose any decrease in plasma electron density. Whenever such a fluctuation is sensed, the stabilization power level is increased sufficiently to minimize the change in plasma impedance. In one embodiment, the auxiliary RF power generator produces a VHF frequency, which is ideal for increasing the plasma electron density or opposing its decrease, as the need arises.

In further embodiments, plural stabilization generators of different frequencies coupled to the reactor are controlled to oppose fluctuations in different components of the plasma impedance. For example, both an LF stabilization source and an HF or VHF stabilization source may be employed in concert to oppose transient-induced changes in both plasma sheath thickness and in plasma electron density. Plasma electron density changes induce changes in the real (resistive) component of the plasma impedance, while plasma sheath thickness changes induce changes in the imaginary (capacitive) component of the plasma impedance. One frequency affects the reactive or imaginary component of the plasma impedance, while the other frequency affects the resistive or real component of the plasma impedance. Therefore both components of plasma impedance are controlled separately. This permits a fluctuation in plasma impedance taking any path in complex impedance space to be opposed or compensated by adjusting the power levels of the two stabilization RF power frequency sources.

FIG. 1A depicts a simple embodiment, in which plasma load impedance presented to a plasma source power generator is to be stabilized. The reactor in this embodiment consists of a reactor chamber 100 having a cylindrical side wall 105 which may be a conductor, a workpiece support 110 and a ceiling 115 defining a processing volume 120. The ceiling 115 includes an electrode 115-1 having a gas distribution showerhead 115-2 on its bottom surface fed by a gas supply 125, and an insulating ring 115-3 separating the electrode 115-1 from the sidewall 105. The workpiece support 110 has a workpiece support surface 110-1 supporting a workpiece 130 which may be a semiconductor wafer, for example. The workpiece support has an electrode 130-1 encapsulated within an insulating layer that includes an upper insulating layer 130-2 between the electrode 130-1 and the workpiece support surface 110-1 and a lower insulating layer 130-3 beneath the electrode 130-1. The lower insulating layer 130-3 is supported on a conductive base 130-4. A vacuum pump 140 evacuates the chamber 100 through a pumping annulus 145 defined between the workpiece support 110 and the sidewall 105.

Plasma source power is applied to the ceiling electrode 115-1 from a VHF power generator 150 through a dynamic impedance match circuit 155.

A low power auxiliary or stabilization RF generator 170 is coupled to the chamber 100, specifically to the wafer support electrode 130-1, through a modulator 175. No impedance match is provided for the stabilization generator 170, since its purpose is to respond to a transient fluctuation in plasma impedance whose speed is beyond the capability of an impedance match circuit. The power level of the stabilization RF power generator 170 is changed by a controller 160 through the modulator 175 in response to a change in plasma impedance. The controller 160 monitors plasma impedance by periodically sampling the instantaneous RF voltage V, RF current I, and RF phase Ø through an RF sensor 165 at the dynamic impedance match 155 of the generator 150. Whenever a fluctuation in plasma impedance is sensed, the controller 160 determines the change in RF stabilization power at the modulator 175 that would oppose the impedance fluctuation.

In one example, the RF frequency of the stabilization power generator 170 is a low frequency or very low frequency that strongly influences the plasma sheath thickness, so as to oppose a fluctuation in plasma sheath thickness affecting plasma capacitance. The controller 160 is programmed to sense fluctuations in plasma capacitance and change the stabilization RF power at the modulator 175 (either an increase or a decrease) so as to oppose the change in capacitance. The result is that the plasma sheath thickness fluctuation is greatly reduced. This reduces the impedance mismatch and the power reflected back to the generator 170.

FIG. 1A illustrates one embodiment of the controller 160. The controller 160 of the illustrated embodiment includes a first processor 161. During successive sample times or cycles of the controller 160, it samples certain RF parameters sensed by the RF sensor 165, such as the RF voltage V, RF current I and RF phase Ø. From these parameters, the processor 161 computes the current load impedance $Z_{new}$ (or, equivalently, admittance). The load impedance $Z_{previous}$ obtained during the previous sample time is held in a delay memory 162. A comparator 163 determines the difference $\Delta Z$ between the current and previous load impedances, corresponding to an impedance change. A processor 164 computes the magnitude of a chosen component (either the real component or the imaginary component) of the impedance change $\Delta Z$. A processor 166 uses this magnitude to determine an appropriate change in the stabilization RF power level through the modulator 175 that is likely to reduce $\Delta Z$ or a component of $\Delta Z$. This determination may be made, for example, by multiplying the magnitude (computed by the processor 164) of the chosen impedance component of $\Delta Z$ by an appropriate scale factor. This scale factor may be determined by the skilled worker using trial and error techniques. The computed change stabilization RF power level is sent as a control signal to the modulator 175.

In one example, the RF stabilization power has an LF frequency and therefore affects plasma sheath thickness and therefore plasma capacitance. In this case, the processor 164 computes the imaginary component of $\Delta Z$, which is the change in reactance or capacitance, $\Delta C$, and from $\Delta C$ computes a change in LF stabilization power likely to reduce induce an opposing change in plasma capacitance. For example, if the controller 160 determines that the change in plasma impedance involves a decrease in plasma capacitance, the controller 160 would control the modulator 175 to decrease the LF power delivered to the plasma, thereby decreasing sheath thickness to oppose the decrease in plasma capacitance. In another example, the RF stabilization power has a VHF frequency and therefore affects plasma electron density and therefore plasma resistance. In this case, the processor 164 computes the real component of $\Delta Z$, the change in resistance, $\Delta R$, and from $\Delta R$ computes a change in VHF stabilization power likely to reduce induce an opposing change in plasma resistance. For example, if the controller 160 determines that the change in plasma impedance involves an increase in plasma resistance, then the controller would command the modulator 175 to increase the amount of VHF power coupled to the plasma so as to increase plasma ion density to oppose the increase in plasma resistance.

Figure 2:
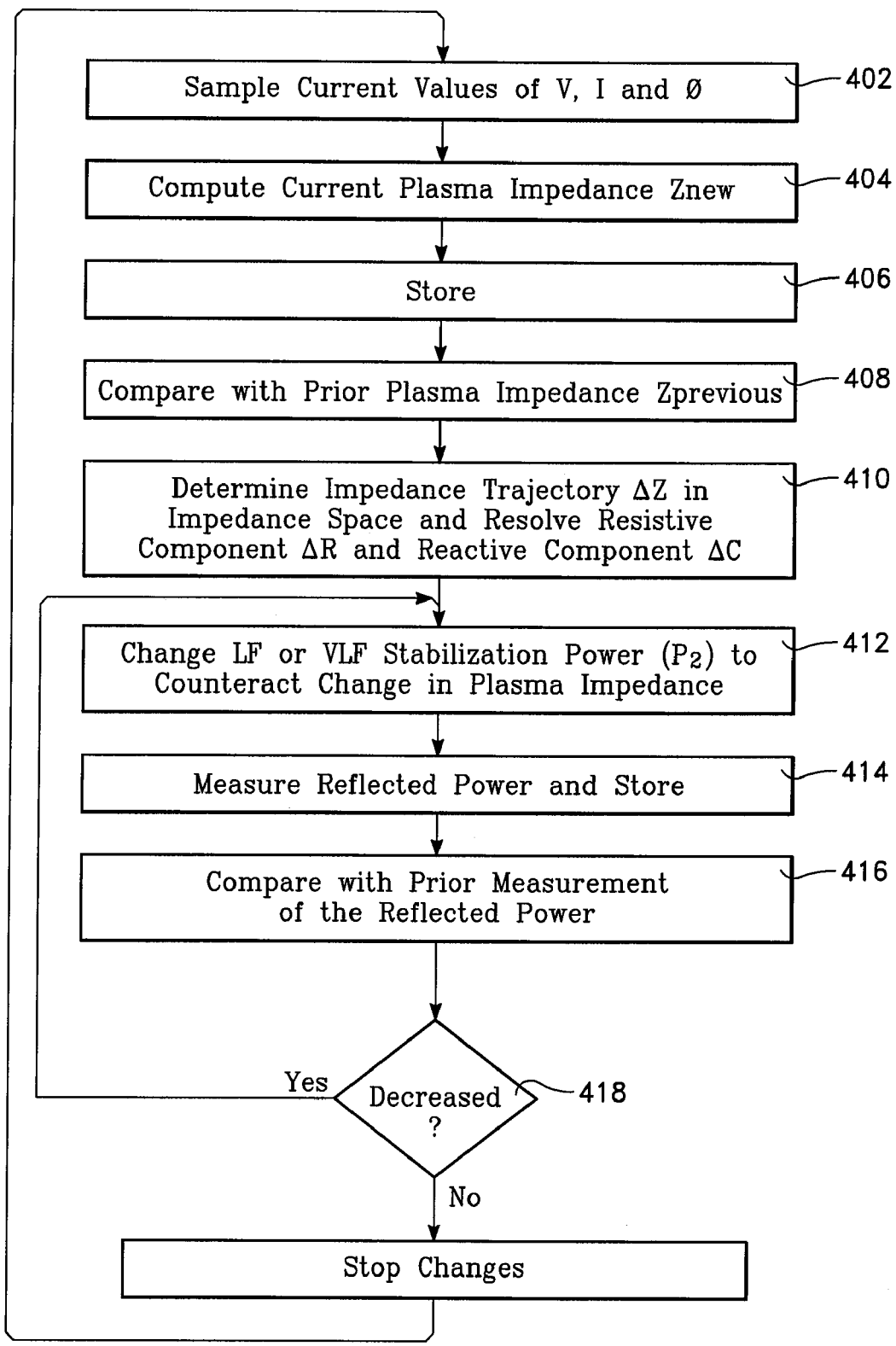
FIG. 2 is a block flow diagram depicting operation of a controller in the embodiments of FIGS. 1A and 1B.

Operation of one cycle of the controller 160 of FIG. 1A is depicted in FIG. 2. The current values of the RF parameters V, I and Ø are sampled at the beginning of the current cycle (block 402). From the RF parameters, the current impedance is computed (block 404) and stored (block 406). The current impedance is compared with the impedance obtained during the prior cycle (block 408), and the change in impedance is determined (block 410), which corresponds to a trajectory in complex impedance space. The controller 160 may determine the magnitude of one component (real or imaginary) of the change in impedance. The controller 160 causes the stabilization RF power to change so as to force the one component of the impedance to reverse its trajectory and approach its former value (block 412). The controller 160 then verifies that the action taken reduced the impedance mis-match at the generator output. The controller 160 obtains the current value of reflected RF power at the impedance match and stores that value (block 414). The current reflected power value is compared with the reflected power value obtained during the previous cycle (block 416). If the reflected power has decreased (YES branch of block 418), this is deemed a success, and the controller 160 may initiate a similar change in stabilization RF power. Otherwise (NO branch of block 418), the controller stops changing the stabilization RF power, and goes to the next process cycle.

As depicted in dashed line in FIG. 1A, the reactor optionally may further include one or more RF plasma bias power generators 180, 185 coupled to the wafer support electrode 130-1 through respective impedance matches 190, 195. The two bias power generators may have different frequencies suitable for adjusting the electron energy distribution function at the surface of the workpiece. For example, the bias power generator 180 may be an LF power generator while the bias power generator 185 may be an VLF or HF power generator. The reflected power at each of the bias generators 180, 185 may be improved by using the stabilization power generator 170 in a manner similar to that discussed above.

Figure 1B:
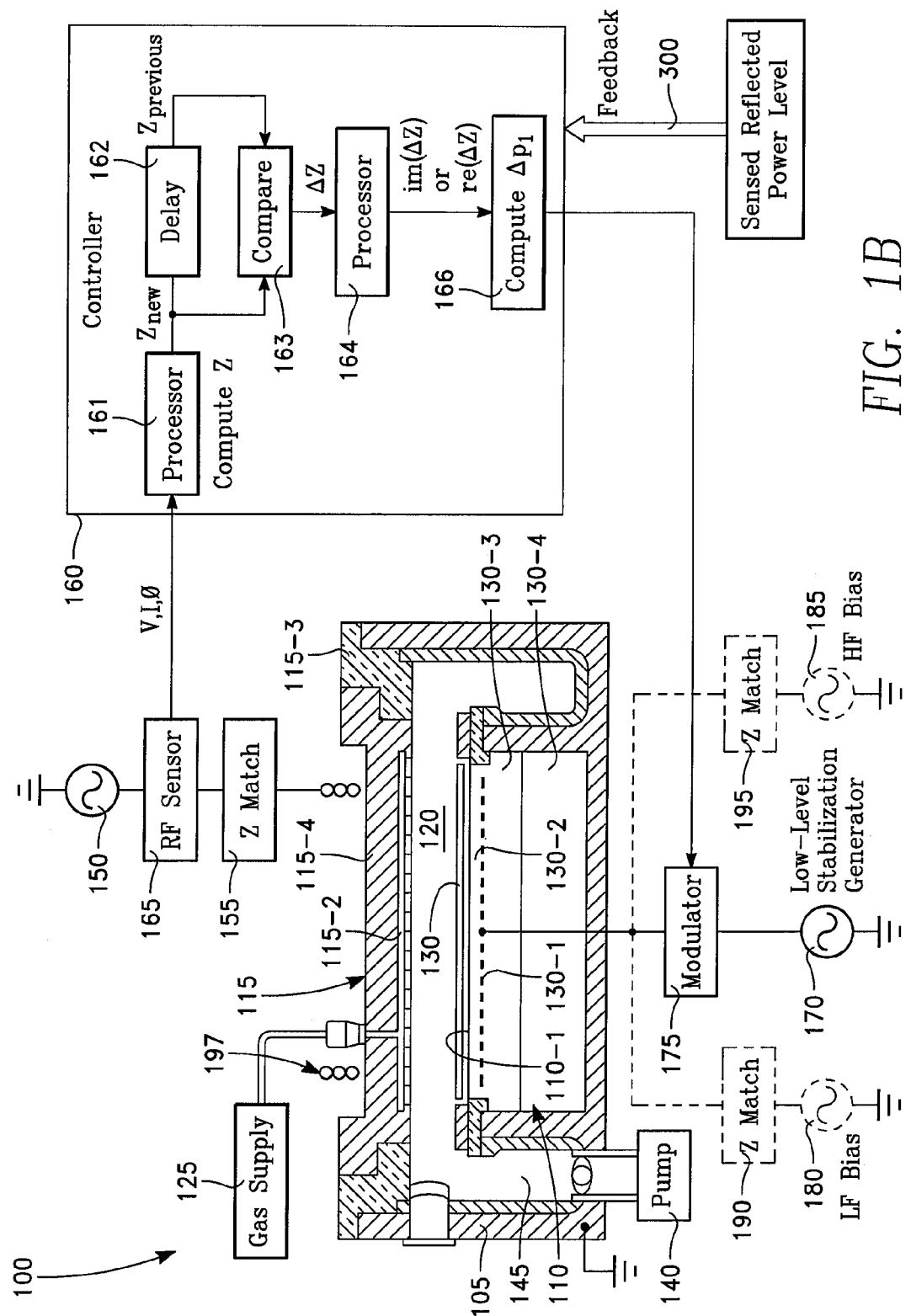

FIG. 1B depicts a modification of the embodiment of FIG. 1A, in which the overhead electrode 115-1 is replaced by a dielectric ceiling 115-4, and an inductive coil antenna 197 receives the RF source power from the generator 150 through the impedance match 155. The plasma is generated by inductive coupling, in which case the frequency of the source power generator 150 may be in the HF or LF range rather than VHF. The controller 160 operates in the same manner in the reactor of FIG. 1B as in the reactor of FIG. 1A to reduce reflected RF power.

Figure 3A:
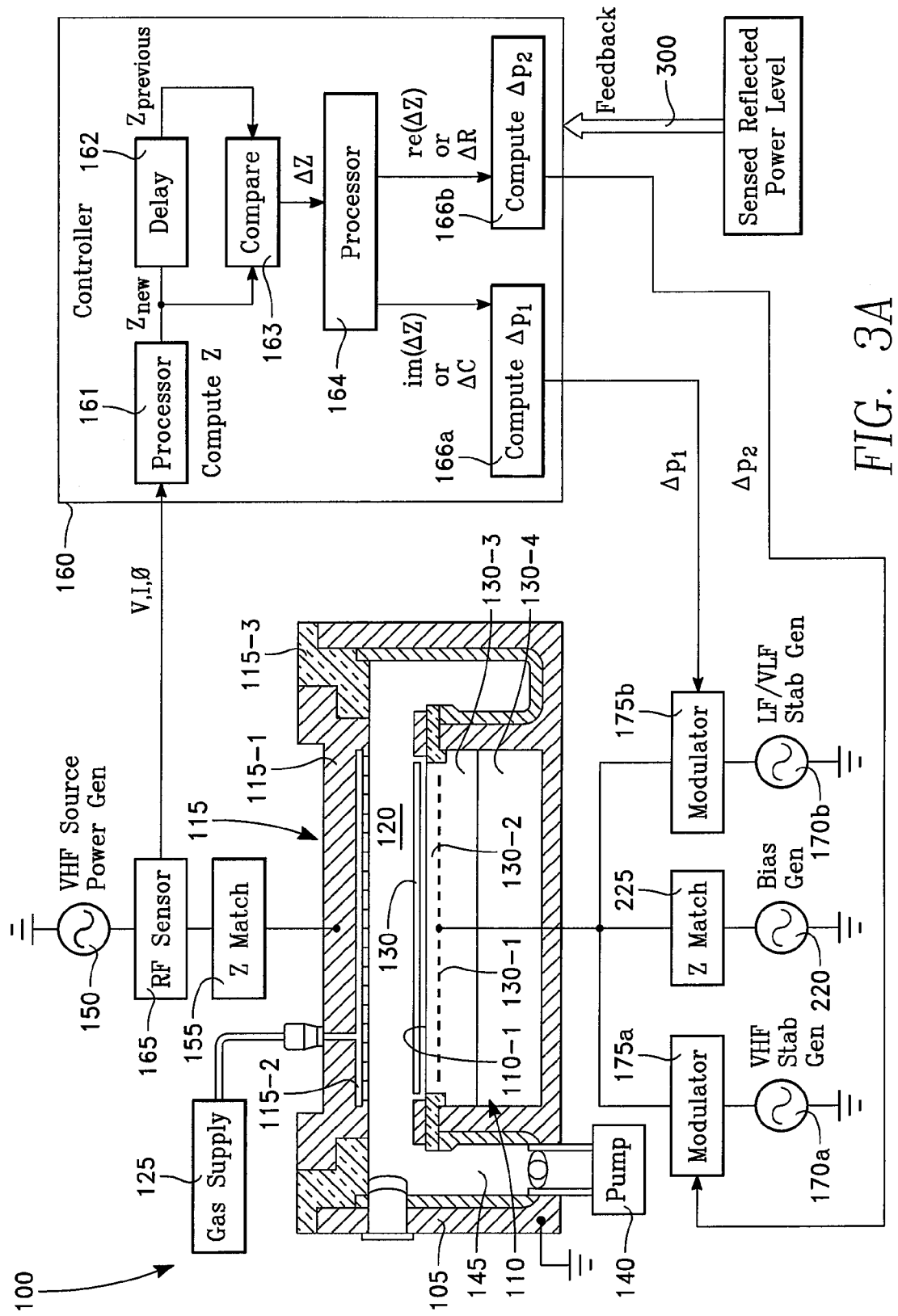
FIGS. 3A and 3B depict embodiments employing dual stabilization RF power generators of different frequencies to stabilize different components of the plasma impedance.

FIG. 3A illustrates a modification of the reactor of FIG. 1A. The reactor of FIG. 3A has at least one bias power generator 220 with impedance match circuit 225 coupled to the support electrode 130-1. The reactor of FIG. 3A has dual stabilization RF power generators 170a, 170b and respective modulators 175a, 175b controlled by separate command signals from the controller 160. While the stabilization generators have different frequencies in various ranges, in the illustrated embodiment the stabilization generator 170*a* is a VHF generator while the stabilization generator 170*b* is an LF or VLF generator. Furthermore, the processor 164 determines both real and imaginary components of ΔZ. In the illustrated embodiment of FIG. 3A, the controller includes dual processors 166*a*, 166*b* that compute respective commands for change in power of the LF generator 170*b* and the VHF generator 170*a*, respectively. These commands are transmitted to the modulators 175*b*, 175*a*, respectively. In the simplest implementation, each processor 166*a*, 166*b* computes a power change command by multiplying the respective component of ΔZ by a selected scale factor. Thus, the processor 166*a* multiplies the real component of ΔZ, i.e., the change in resistance, ΔR, by a scale factor, the sign of ΔR being determined by whether it represents an increase or a decrease. Likewise, the processor 166*b* multiplies the imaginary component of ΔZ, i.e., the change in reactance or capacitance, ΔC, by a scale factor, the sign of ΔC being determined by whether it represents an increase or a decrease.

Figure 3B:
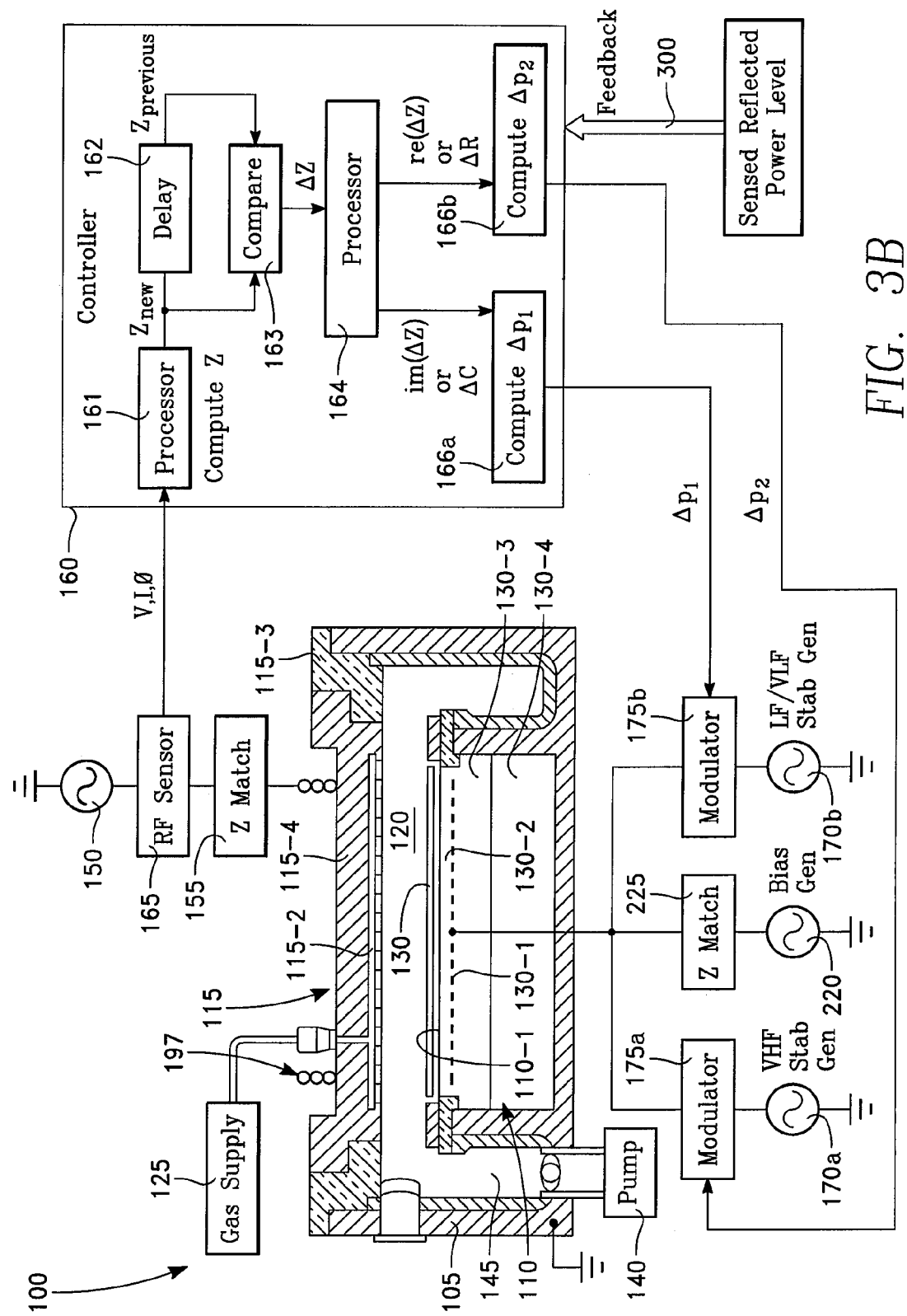

FIG. 3B depicts a modification of the reactor of FIG. 3A in which the source power generator 150 and its impedance match circuit 155 are connected to an overhead coil antenna 197. In this case, the entire ceiling 115 may be formed of a dielectric material, the conductive electrode 115-1 being absent. With the coil antenna 197, RF plasma source power is inductively coupled into the chamber 120, and therefore need not be of a VHF frequency. Therefore, in FIG. 3B, the RF source power generator 150 may be of an LF or HF frequency, for example.

Figure 4:
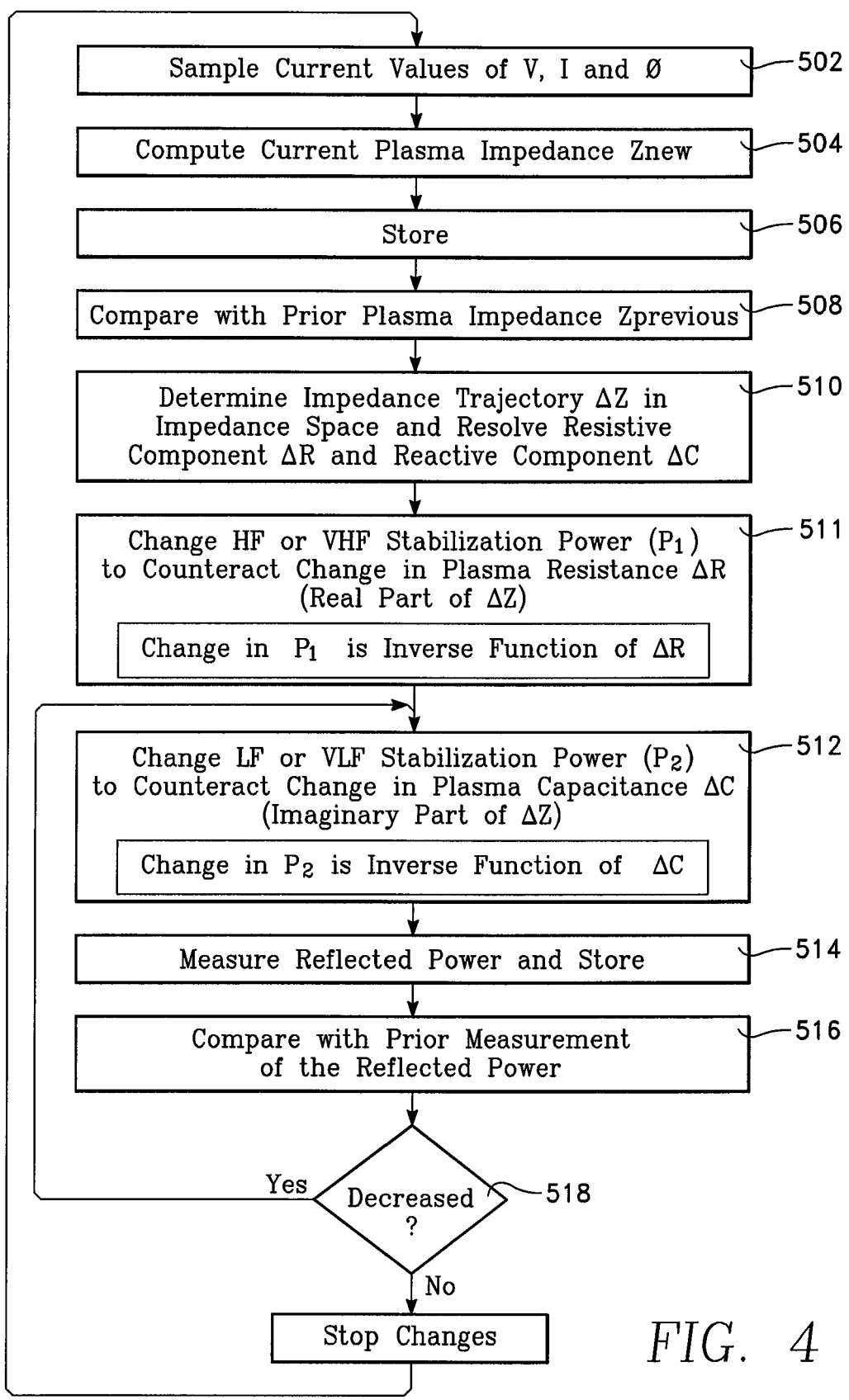
FIG. 4 is a block flow diagram depicting operation of a controller in the embodiments of FIGS. 3A and 3B.

Operation of one cycle of the controller 160 of FIG. 3A is depicted in FIG. 4. The current values of the RF parameters V, I and Ø are sampled at the beginning of the current cycle (block 502). From the RF parameters, the current impedance is computed (block 504) and stored (block 506). The current impedance is compared with the impedance obtained during the prior cycle (block 508), and the change in impedance is determined (block 510), which corresponds to a trajectory in complex impedance space. The controller 160 determines the magnitudes of the real component (resistance) and imaginary component (capacitance) of the change in impedance. The controller 160 computes a change in the VHF stabilization power level that opposes the change in resistance (block 511) and transmits a corresponding command to the modulator 175*a*. The controller 160 computes a change in the LF stabilization power level that opposes the change in capacitance (block 512) and transmits a corresponding command to the modulator 175*b*. The controller 160 then verifies that the action taken improved the impedance match. The controller 160 obtains the current value of reflected RF power at the impedance match and stores that value (block 514). The current reflected power value is compared with the reflected power value obtained during the previous cycle (block 516). If the reflected power has decreased (YES branch of block 518), this is deemed a success, and the controller 160 may initiate a similar change in stabilization RF power. Otherwise (NO branch of block 518), the controller stops changing the stabilization RF power, and goes to the next process cycle.

Figure 5:
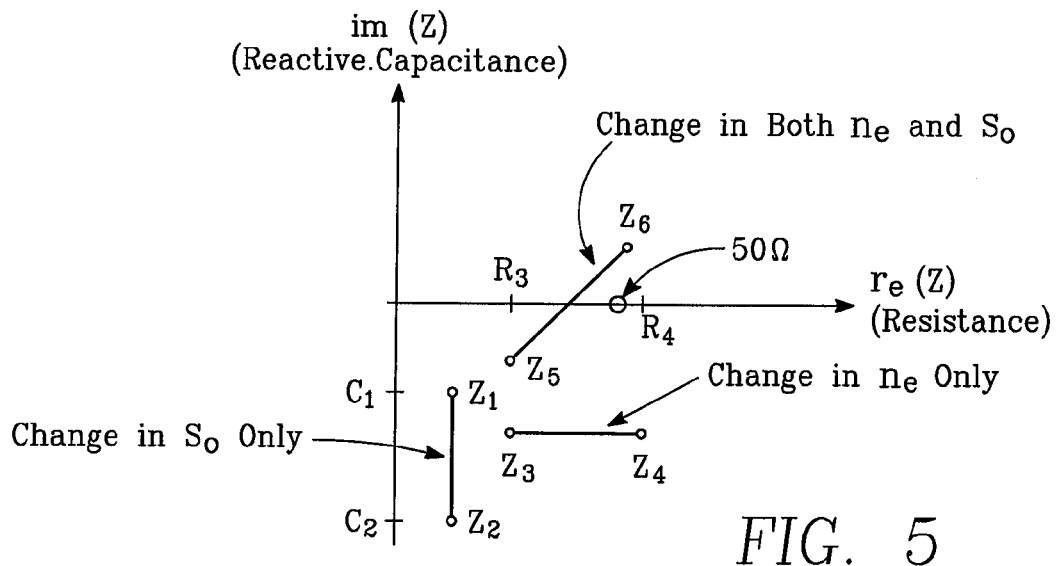
FIG. 5 is a graph of a complex plane depicting different trajectories of the plasma impedance that can be produced by the controller in the embodiments of FIGS. 3A and 3B.
Figure 6A:
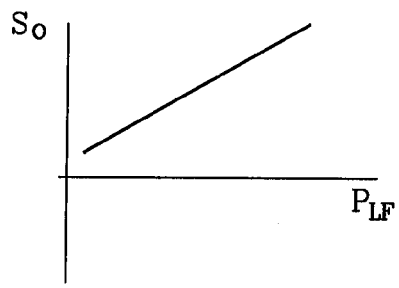
FIG. 6A is a graph depicting plasma sheath thickness as a function of low frequency stabilization RF power.
Figure 6B:
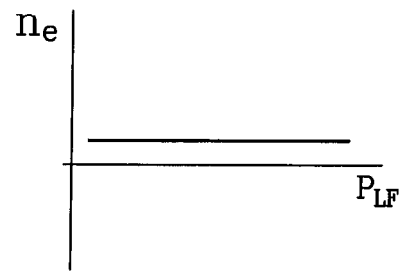
FIG. 6B is a graph depicting plasma electron density as a function of low frequency stabilization RF power.
Figure 6C:
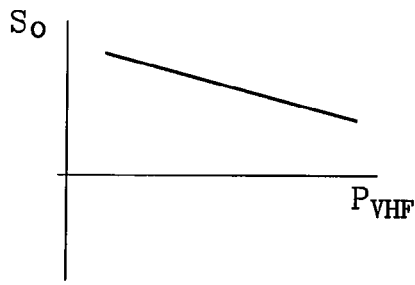
FIG. 6C is a graph depicting plasma sheath thickness as a function of very high frequency stabilization RF power.
Figure 6D:
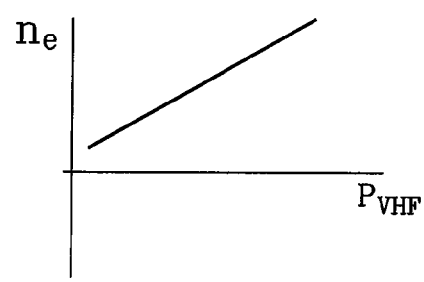
FIG. 6D is a graph depicting plasma electron density as a function of very high frequency stabilization RF power.

FIG. 5 is a graph depicting plasma impedance in the complex plane, the vertical axis corresponding to the imaginary component and the horizontal axis corresponding to the real component of impedance. The point labeled "50Ω" on the horizontal axis corresponds to the output impedance of a source power generator or bias power generator of the reactor, to which the plasma load impedance is to be matched. The vertical line extending between the two points labeled $Z_1$ and $Z_2$ represents a change in plasma impedance in which only the reactance (capacitance) has changed, for example from $C_1$ to $C_2$. This change corresponds to a change in plasma sheath thickness $s_0$. The horizontal line extending between the two points labeled $Z_3$ and $Z_4$ represents a change in plasma impedance in which only the resistance has changed, for example from $R_3$ to $R_4$. This change corresponds to a change in plasma electron density $n_e$. The diagonal line extending between the two points $Z_5$ and $Z_6$ represent a change in impedance that is the result of a combination of the two foregoing changes, namely a change in plasma capacitance and a change in plasma resistance. The plasma impedance can be moved in the complex plane of FIG. 5 in any direction by a judicious choice of changes in LF and VHF stabilization RF power. As shown in the graph of FIG. 6A, the plasma sheath thickness, $s_0$, which affects plasma capacitance, increases with increasing levels of LF stabilization power. However, plasma electron density $n_e$, which affects plasma resistance, is nearly unaffected by changes in the LF stabilization power level, as indicated in the graph of FIG. 6B. As shown in the graph of FIG. 6C, the plasma sheath thickness, $s_0$, which affects plasma capacitance, decreases with increasing levels of VHF stabilization power. As shown in FIG. 6D, the plasma electron density $n_e$ increases with increasing levels of VHF stabilization power.

Figure 7A:
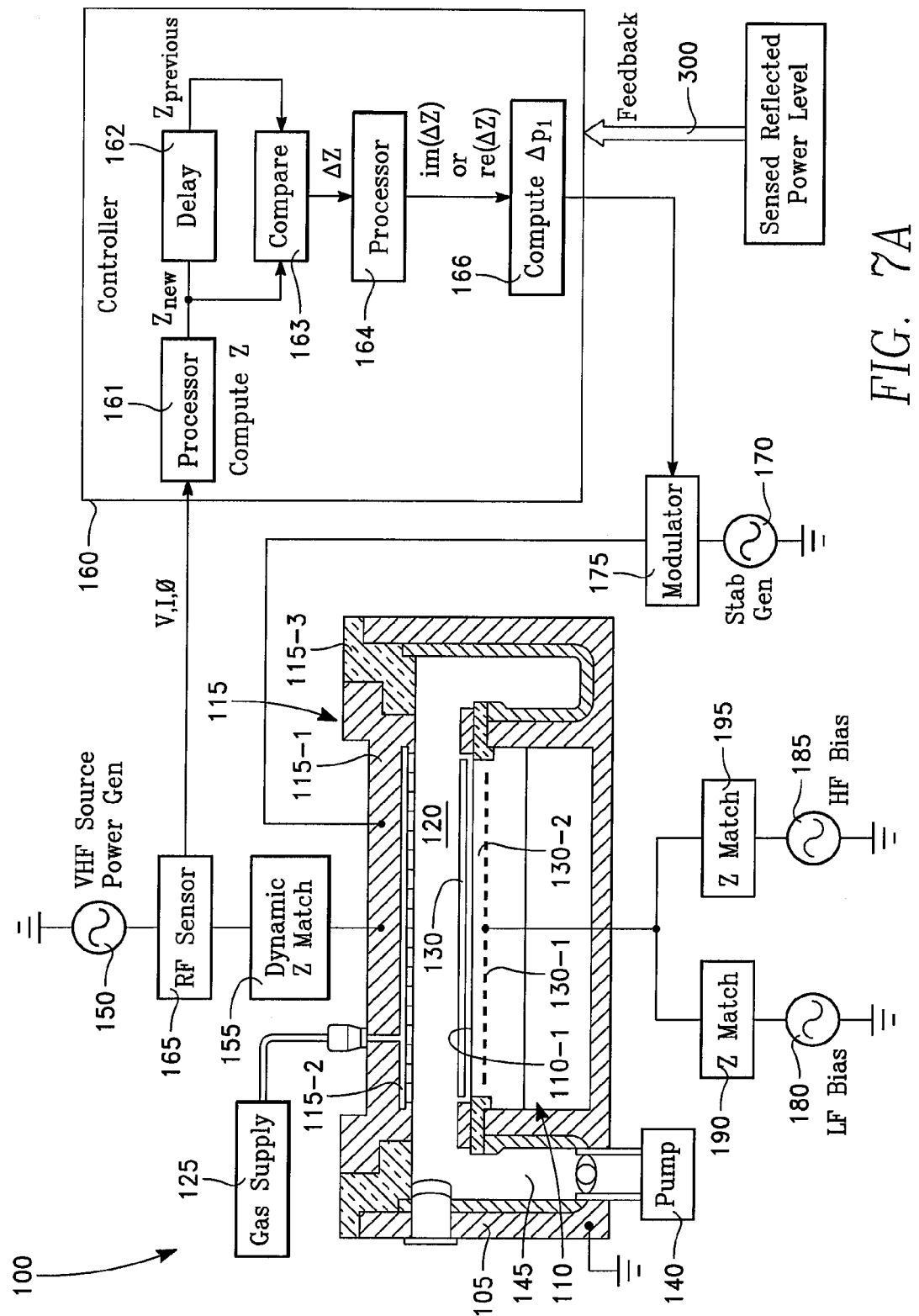
FIGS. 7A through 7C depict embodiments in which stabilization RF power is applied to a ceiling electrode.

FIG. 7A depicts an embodiment in which the output of the stabilization generator 170 and modulator 175 are applied to the ceiling electrode 115-1 rather than the wafer support electrode 130-1.

Figure 7B:
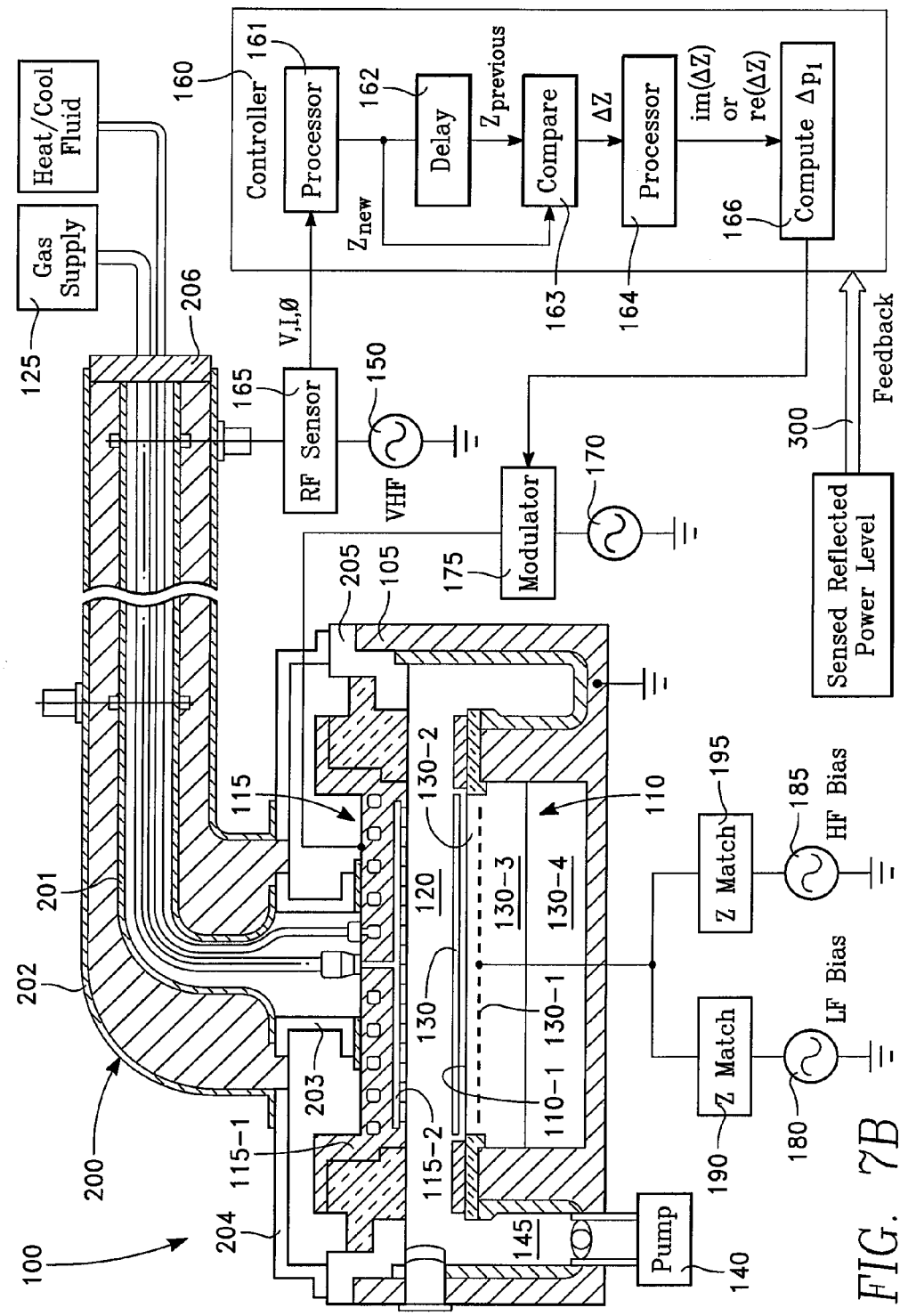

FIG. 7B depicts a similar embodiment, but in which the dynamic impedance match 155 has been replaced by a fixed impedance match element, such as a coaxial tuning stub 200. The coaxial tuning stub 200 has coaxial hollow inner and outer conductors 201, 202, the inner conductor 201 being coupled to the ceiling electrode 115-1 through a conductive ring 203, and the outer conductor 202 being coupled to the chamber sidewall 105 through conductive rings 204, 205. A conductor disk 206 at the far end of the coaxial stub 200 shorts the inner and outer conductors 201, 202 together. The VHF source power generator 150 is connected across the inner and outer coaxial conductors at a predetermined location along the length of the coaxial tuning stub 200. The gas supply 125 is connected via conduits to the gas distribution showerhead 115-2 through the hollow interior of the inner conductor 201. In this embodiment, the stabilization power generator 170 reduces RF power reflected back to the bias power generators 180, 185.

Figure 7C:
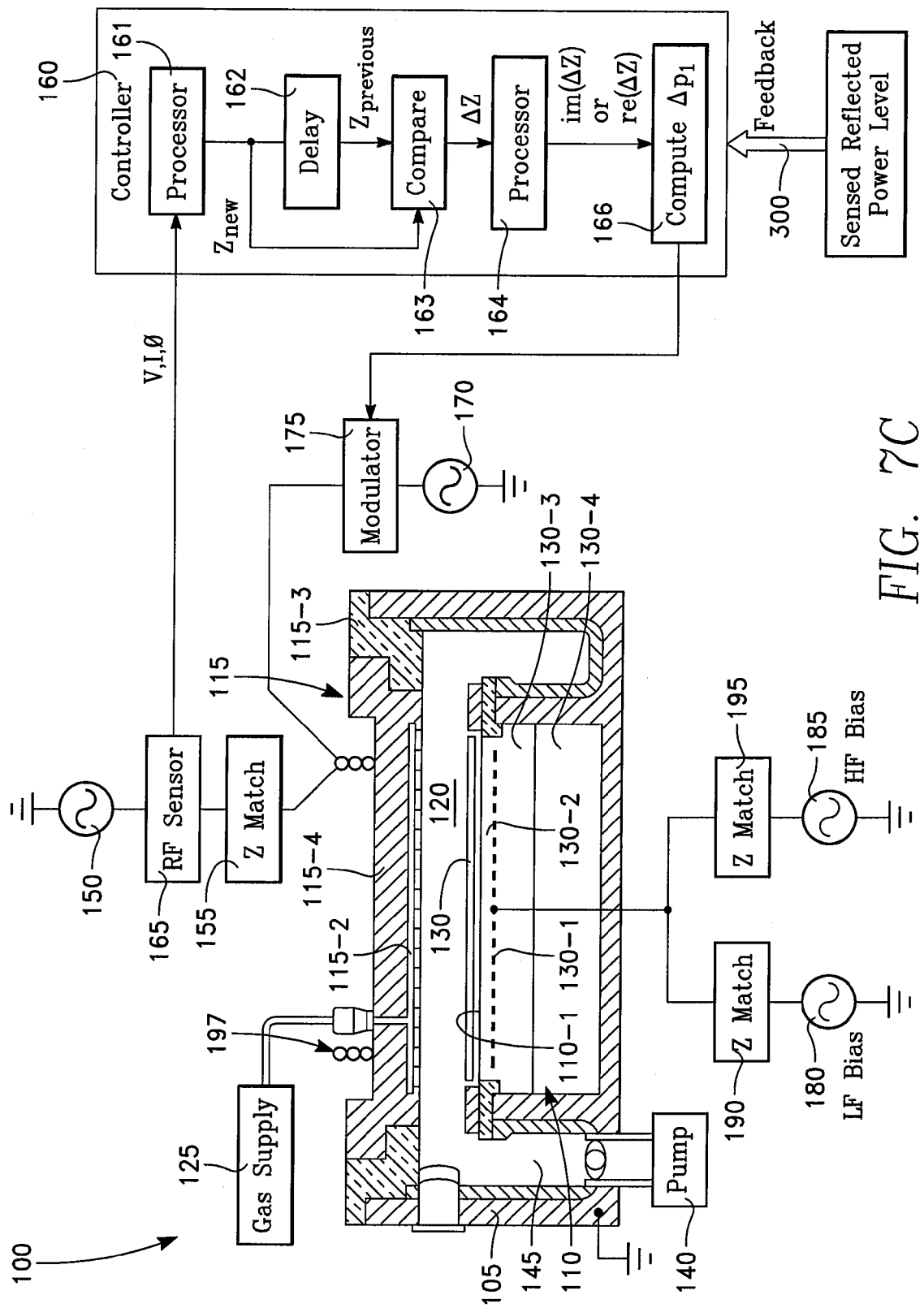

FIG. 7C depicts a modification of the reactor of FIG. 7A, in which the overhead electrode 115-1 is replaced by a dielectric ceiling 115-4, and an inductive coil antenna 197 overlying the ceiling 115 receives the RF source power from the generator 150 through the impedance match 155. The plasma is generated by inductive coupling, in which case the frequency of the source power generator 150 may be in the HF or LF range rather than VHF. The output of the stabilization power generator 170 and its modulator 175 may be coupled directly to the coil antenna 197, as depicted in the drawing, in which case the stabilization power generator 170 may be an HF or LF generator to have the desired effect upon plasma electron density. Alternatively, the ceiling 115 may include an overhead electrode (not shown) that is nearly transparent to the coil antenna 197, such as a Faraday shield for example, and the stabilization generator modulator 175 is connected to this overhead electrode. In this alternative case, the frequency of the stabilization generator 170 is a VHF frequency in order to affect plasma electron density through capacitive coupling.

Figure 8A:
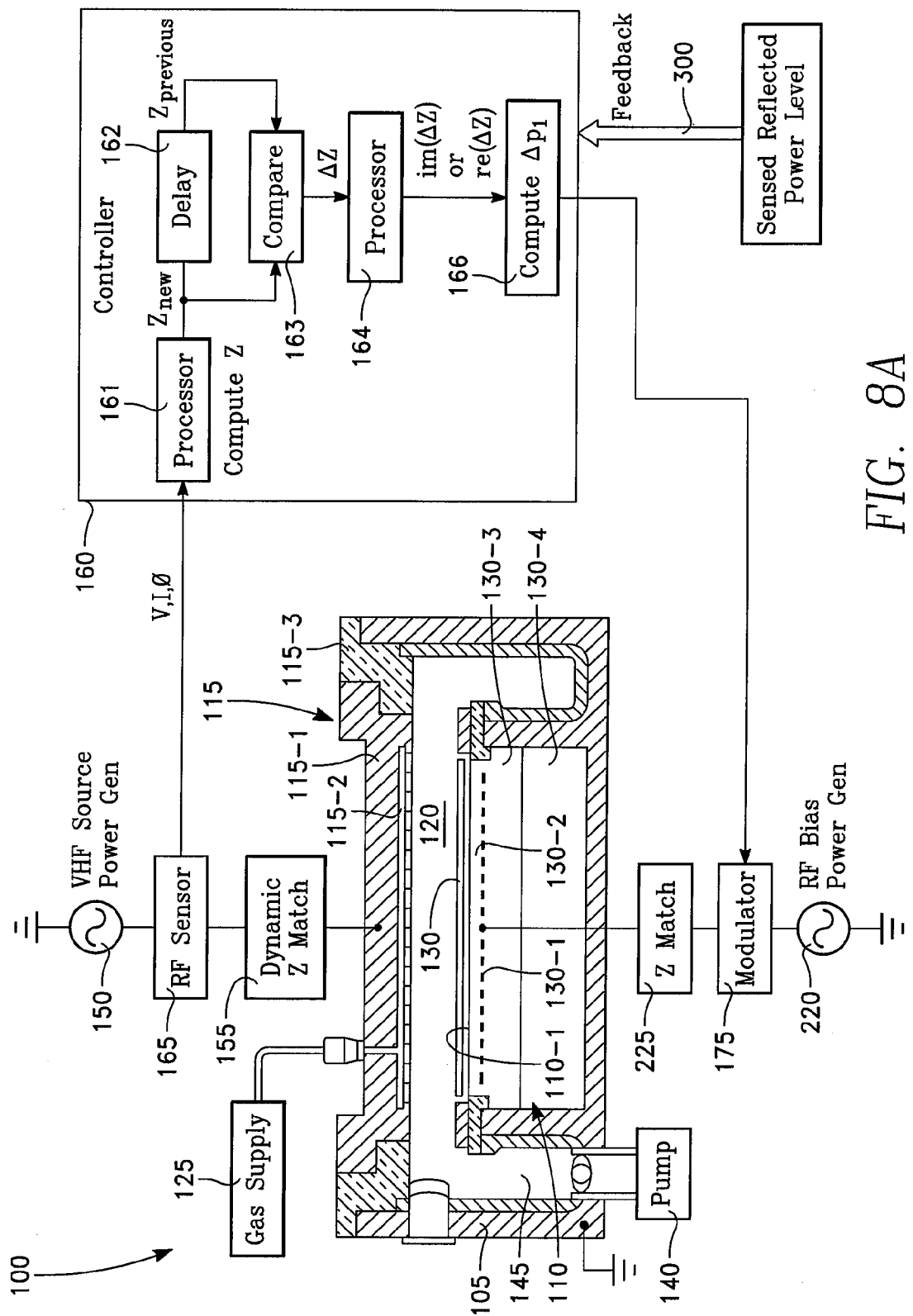
FIGS. 8A through 8D depict embodiments in which stabilization RF power is obtained by modulating an existing bias power generator.

FIG. 8A depicts an embodiment in which stabilization power is provided by modulating power from a pre-existing bias power generator. This obviates the need to provide a dedicated stabilization RF power generator, such as the stabilization power generator 170 of FIG. 1A. In the embodiment of FIG. 8A, the reactor includes an RF bias power generator 220 (which may be a high power RF generator) coupled to the workpiece support electrode 130-1 through an impedance match circuit 225. The modulator 175 controls the output of the bias power generator 220 in such a way as to stabilize the plasma impedance under control of the controller 160. In one example, the modulator 175 may impose less than 100% modulation of the RF bias power. Modulation of the bias power generator 220 in FIG. 8A output may have the same effect as the provision of the stabilization power generator 170 in FIG. 1A. The bias power generator 220 may produce very high power level (e.g., in the range of kilowatts), and therefore the desired stabilization effect may be obtained by only a small modulation (e.g., 5%) of the output of the bias power generator 220.

Figure 8B:
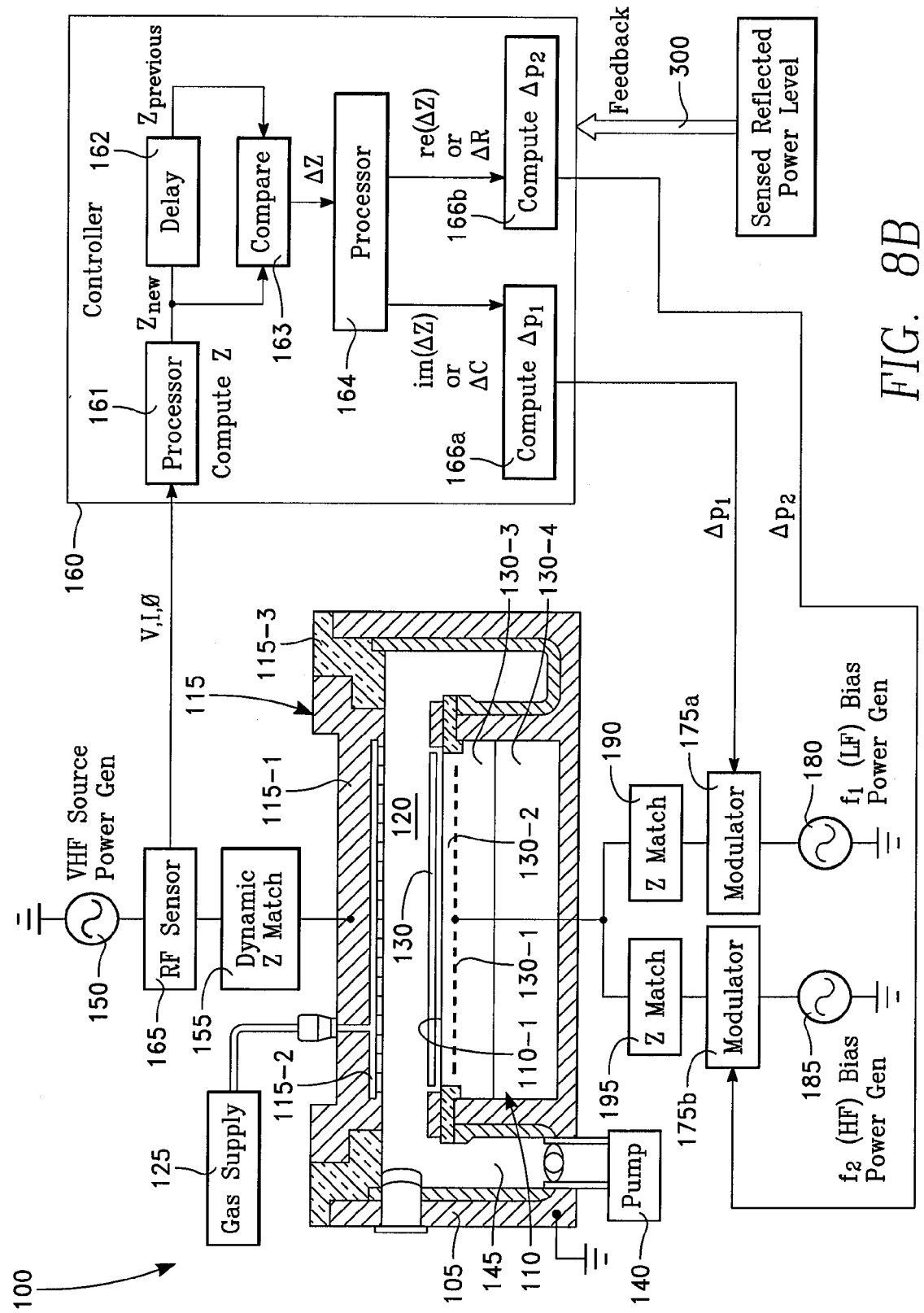

FIG. 8B depicts a modification of the reactor of FIG. 8A, in which there are plural RF bias power generators of different frequencies coupled to the wafer support electrode 130-1, which is a feature useful for selecting the ion energy distribution function. In the illustrated embodiment, there are two bias power generators, 180, 185, coupled to the wafer support electrode 130-1 through respective impedance match circuits 190, 195. The RF bias generators 180, 185 may for example be LF and HF generators, respectively. The two generators 180, 185 also perform plasma impedance stabilization. Modulators 175a, 175b are coupled to the outputs of the bias power generators 180, 185, respectively. The modulators 175a, 175b are governed by the controller 160 in the manner described above with reference to FIGS. 3A and 4.

Figure 8C:
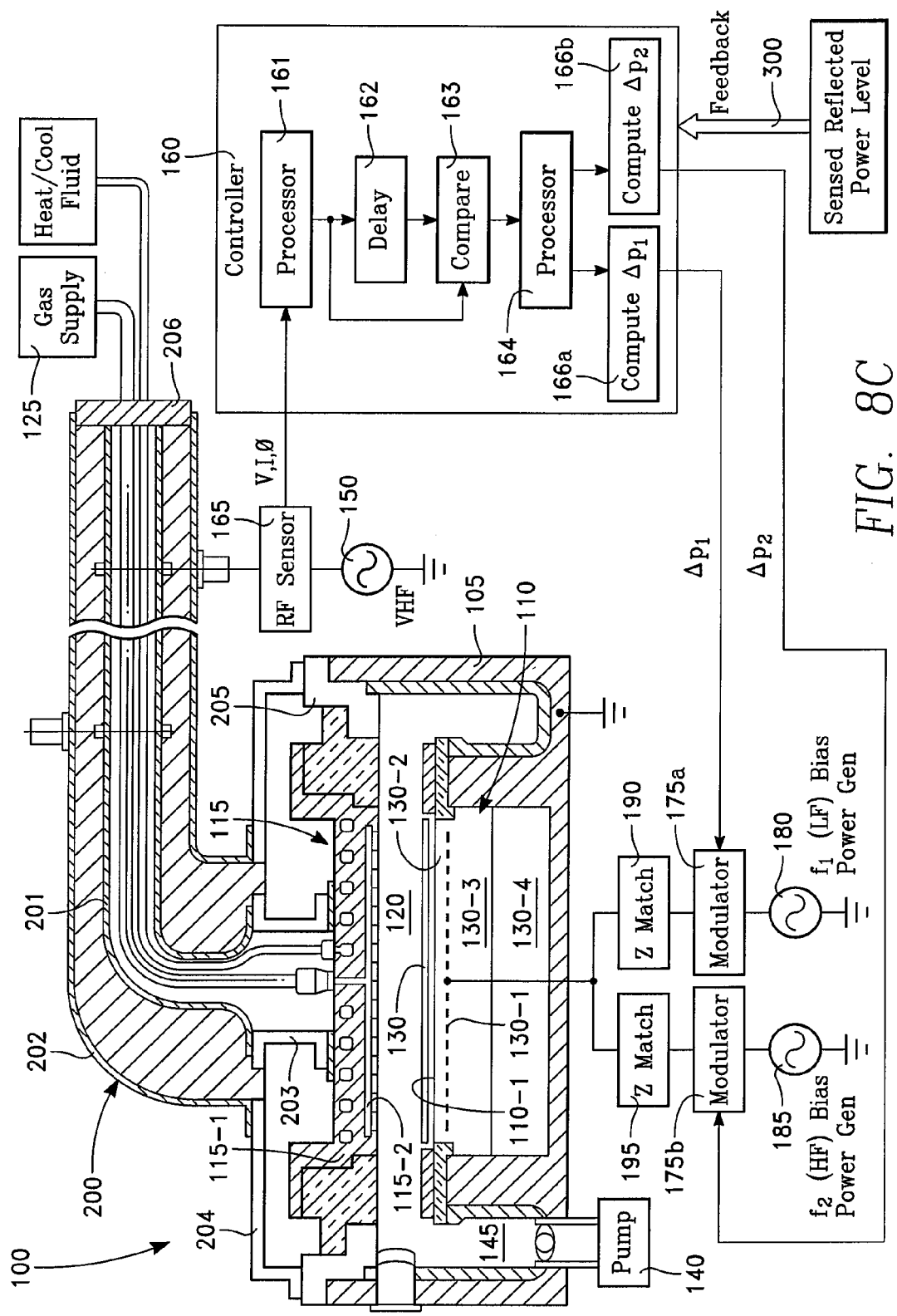

FIG. 8C depicts a modification of the reactor of FIG. 8B in which the dynamic impedance match 155 has been replaced by a fixed impedance match element, such as a coaxial tuning stub 200. The coaxial tuning stub 200 has coaxial hollow inner and outer conductors 201, 202, the inner conductor 201 being coupled to the ceiling electrode 115-1 through a conductive ring 203, and the outer conductor 202 being coupled to the chamber sidewall 102 through conductive rings 204, 205. A conductor disk 206 at the far end of the coaxial stub 200 shorts the inner and outer conductors 201, 202 together. The VHF source power generator 150 is connected across the inner and outer coaxial conductors at a predetermined location along the length of the coaxial tuning stub 200. The gas supply 125 is connected via conduits to the gas distribution showerhead 115-2 through the hollow interior of the inner conductor 201.

Figure 8D:
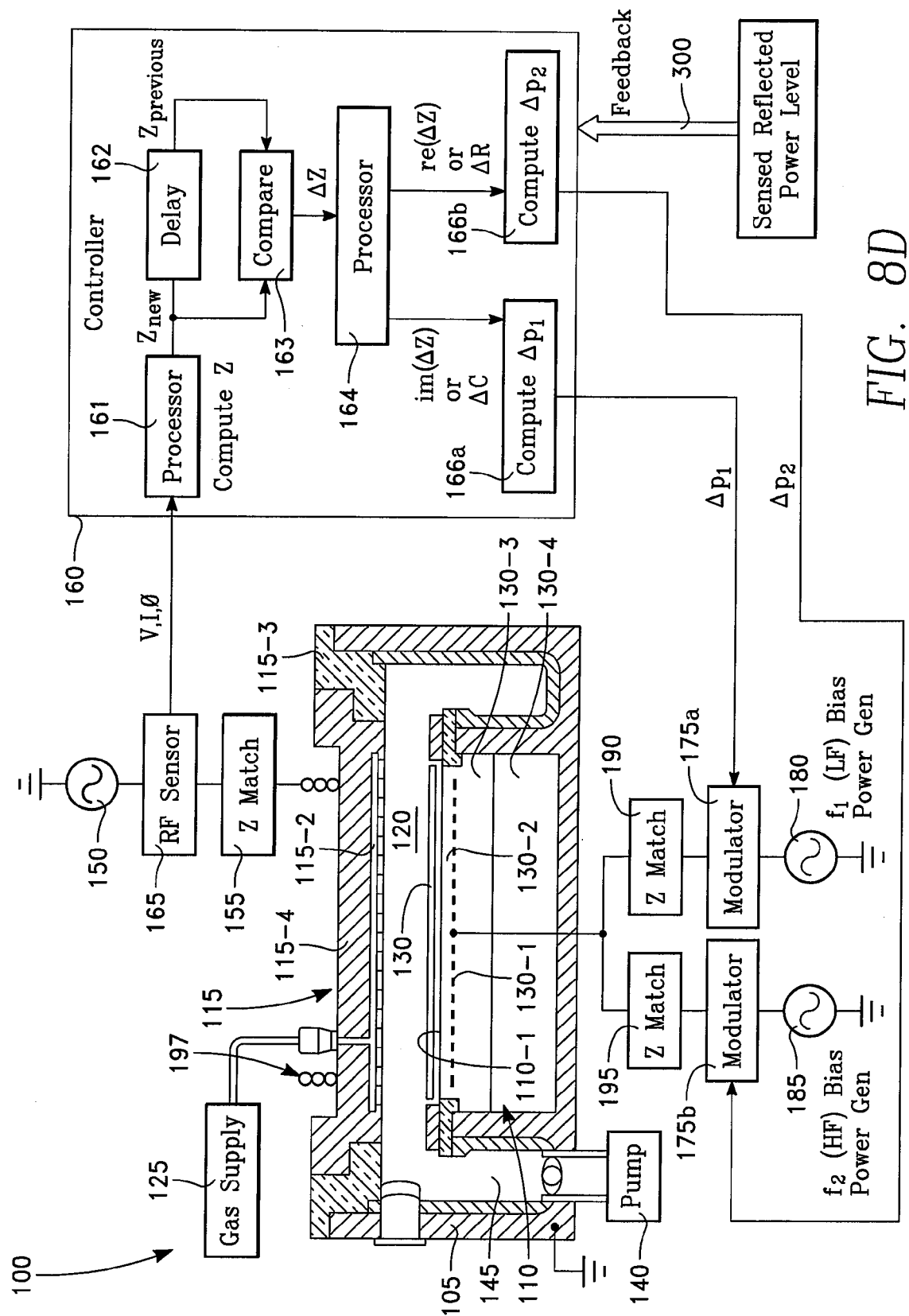

FIG. 8D depicts another modification of the reactor of FIG. 8B, in which the overhead electrode 115-1 is replaced by a dielectric ceiling 115-4, and an inductive coil antenna 197 overlying the ceiling 115 receives the RF source power from the generator 150 through the impedance match 155. The plasma is generated by inductive coupling, in which case the frequency of the source power generator 150 may be in the HF or LF range rather than VHF.

Figure 9A:
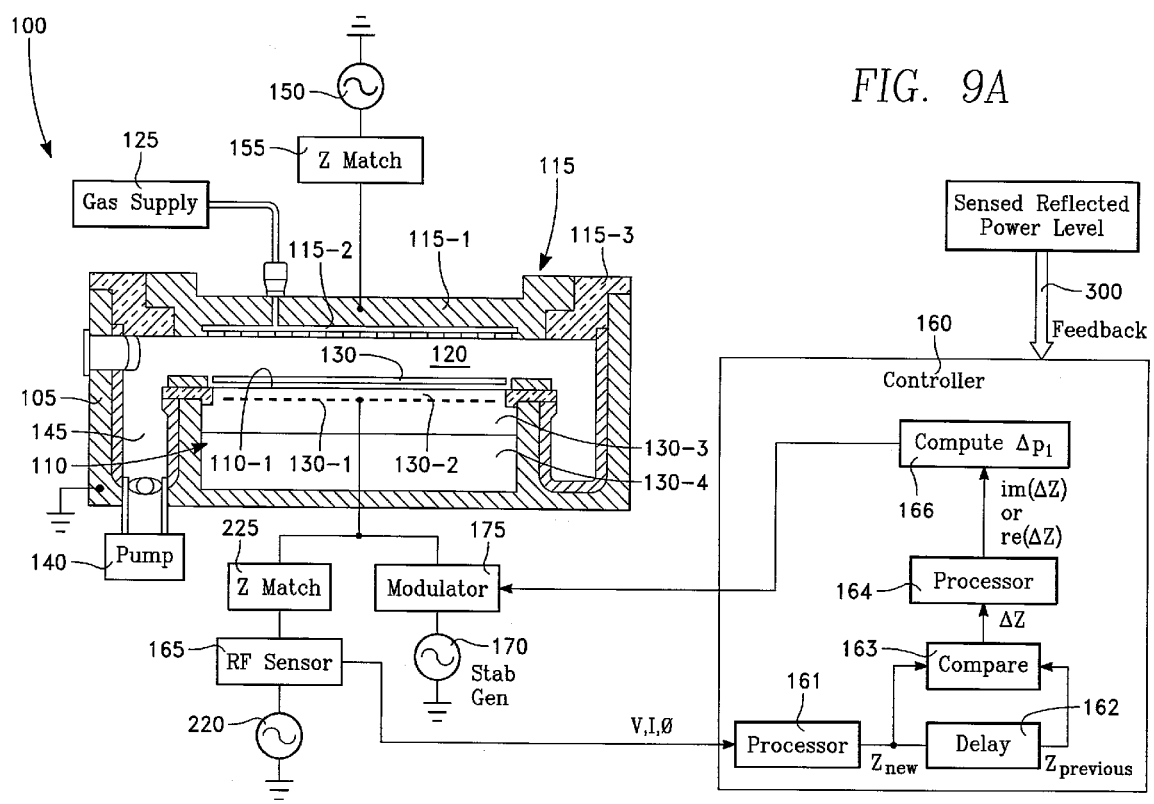
FIGS. 9A and 9B depict embodiments in which plasma load impedance that is to be stabilized is sensed at the wafer support or RF bias power generator.

In the reactor of FIG. 9A, the plasma impedance is sensed at the bias power generator 220 and match 225 by locating the RF sensor 165 with the bias impedance match 225, as shown in the drawing. Load impedance at the bias is stabilized against fluctuations in plasma conditions. The stabilization RF power generator 170 is coupled through the modulator 175 to the wafer support electrode 130-1 without an impedance match between the stabilization generator 170 and the wafer support electrode 130-1. The RF bias power generator 220 is, typically, either an LF generator (e.g., having a frequency in the kHz range or a few MHz) or an HF generator (e.g., having a frequency from several MHz up to about 30 MHz).

Figure 9B:
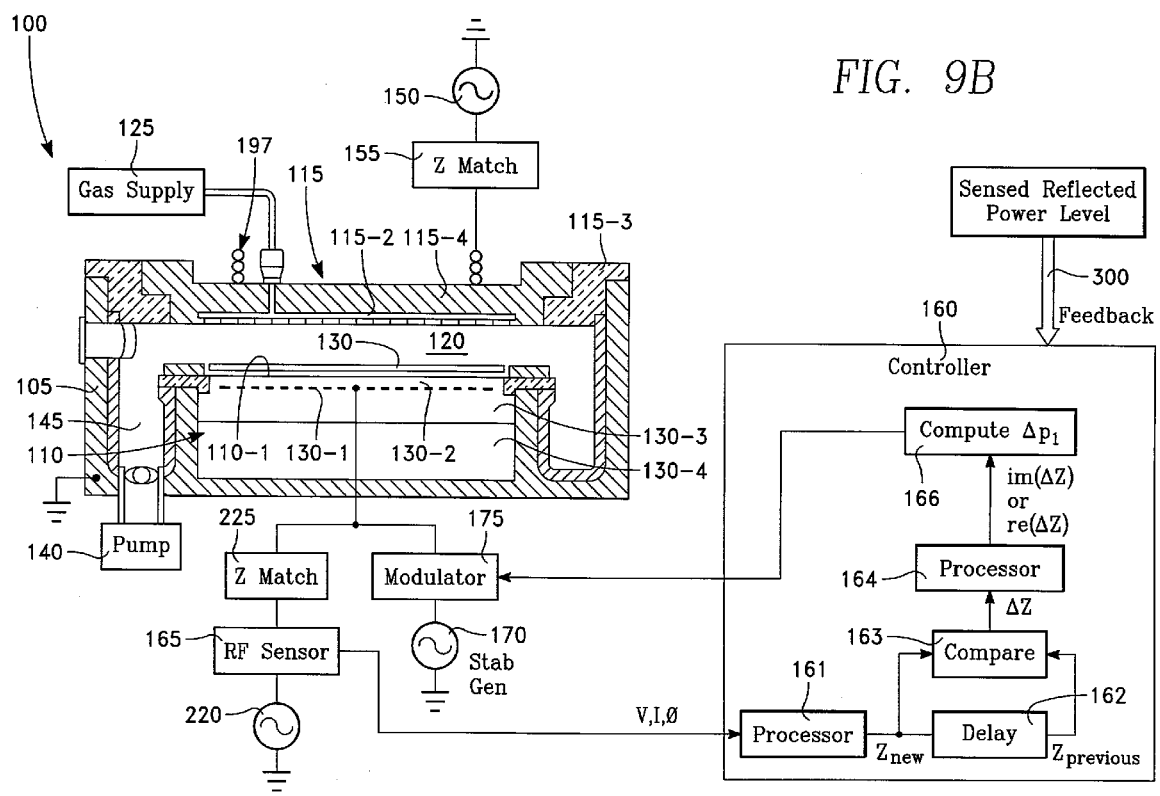

FIG. 9B depicts a modification of the reactor of FIG. 9A, in which the overhead electrode 115-1 is replaced by a dielectric ceiling 115-4, and an inductive coil antenna 197 overlying the ceiling 115 receives the RF source power from the generator 150 through the impedance match 155. The plasma is generated by inductive coupling, in which case the frequency of the source power generator 150 may be in the HF or LF range rather than VHF.

Figure 10A:
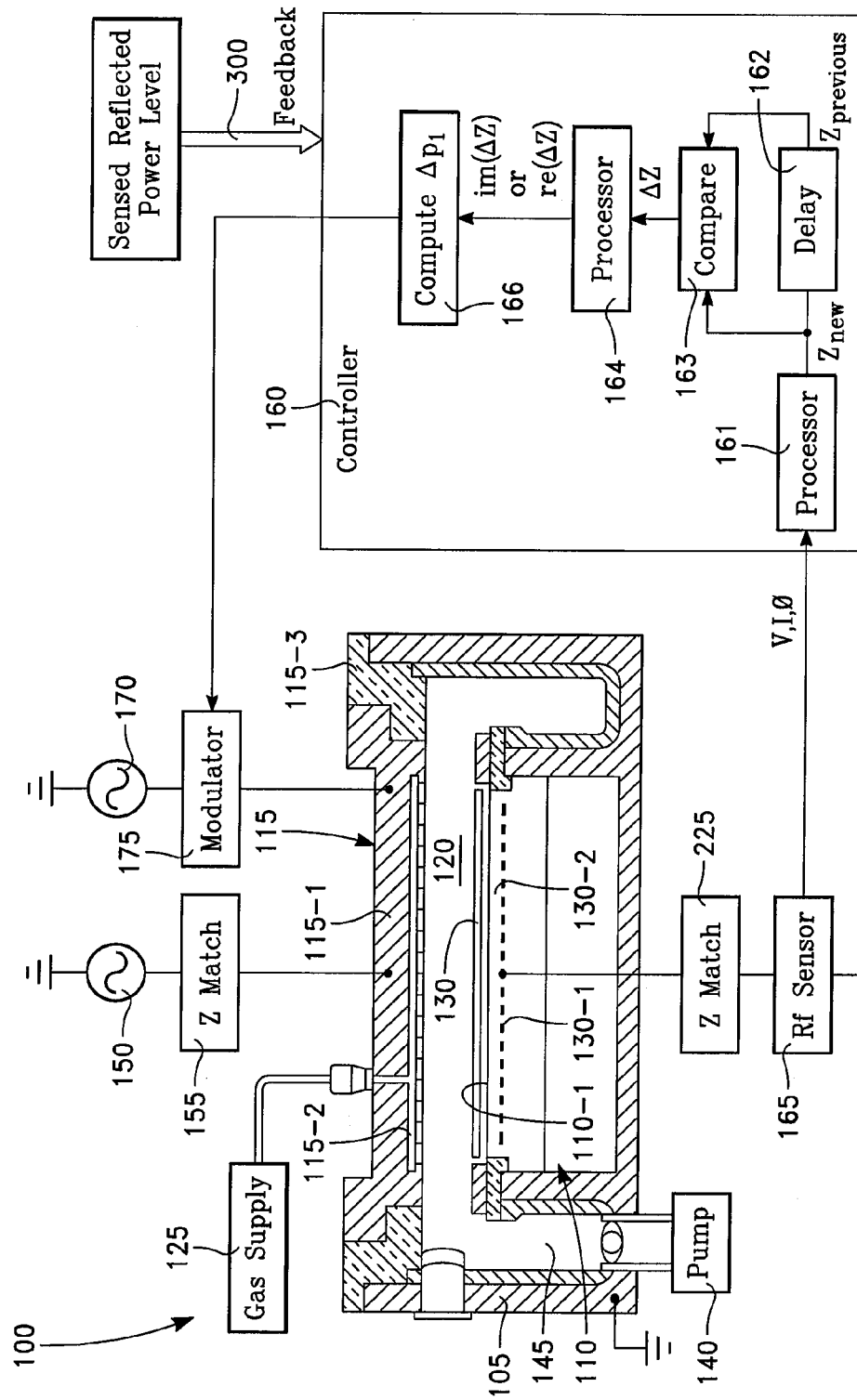
FIGS. 10A and 10B depict embodiments in which plasma load impedance that is to be stabilized is sensed at the wafer support or RF bias power generator and stabilization RF power is applied to the ceiling electrode or RF plasma source power applicator.

FIG. 10A depicts a modification of the reactor of FIG. 9A in which the output of the stabilization RF power generator 170 and modulator 175 is coupled to the ceiling electrode 115-1, without an intervening impedance match element or circuit, rather than being coupled to the wafer support electrode 130-1.

Figure 10B:
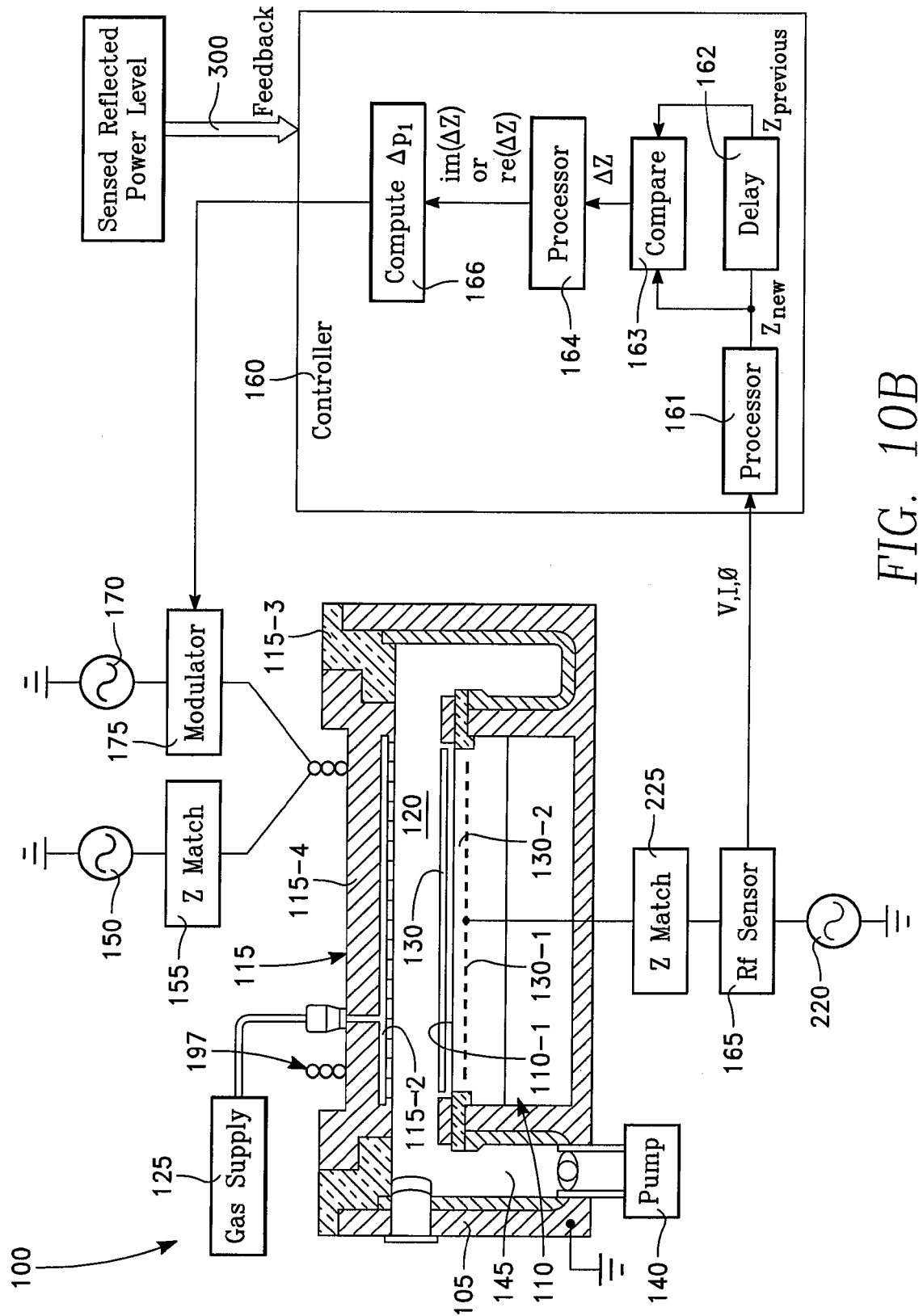

FIG. 10B depicts a modification of the reactor of FIG. 10A, in which the overhead electrode 115-1 is replaced by a dielectric ceiling 115-4, and an inductive coil antenna 197 overlying the ceiling 115 receives the RF source power from the generator 150 through the impedance match 155. The plasma is generated by inductive coupling, in which case the frequency of the source power generator 150 may be in the HF or LF range rather than VHF. The output of the stabilization power generator 170 and its modulator 175 may be coupled directly to the coil antenna 197, as depicted in the drawing, in which case the stabilization power generator 170 may be an HF or LF generator to have the desired effect upon plasma electron density. Alternatively, the ceiling 115 may include an overhead electrode (not shown) that is nearly transparent to the coil antenna 197, such as a Faraday shield for example. In this alternative case, the frequency of the stabilization generator 170 is a VHF frequency in order to affect plasma electron density through capacitive coupling.

Figure 11A:
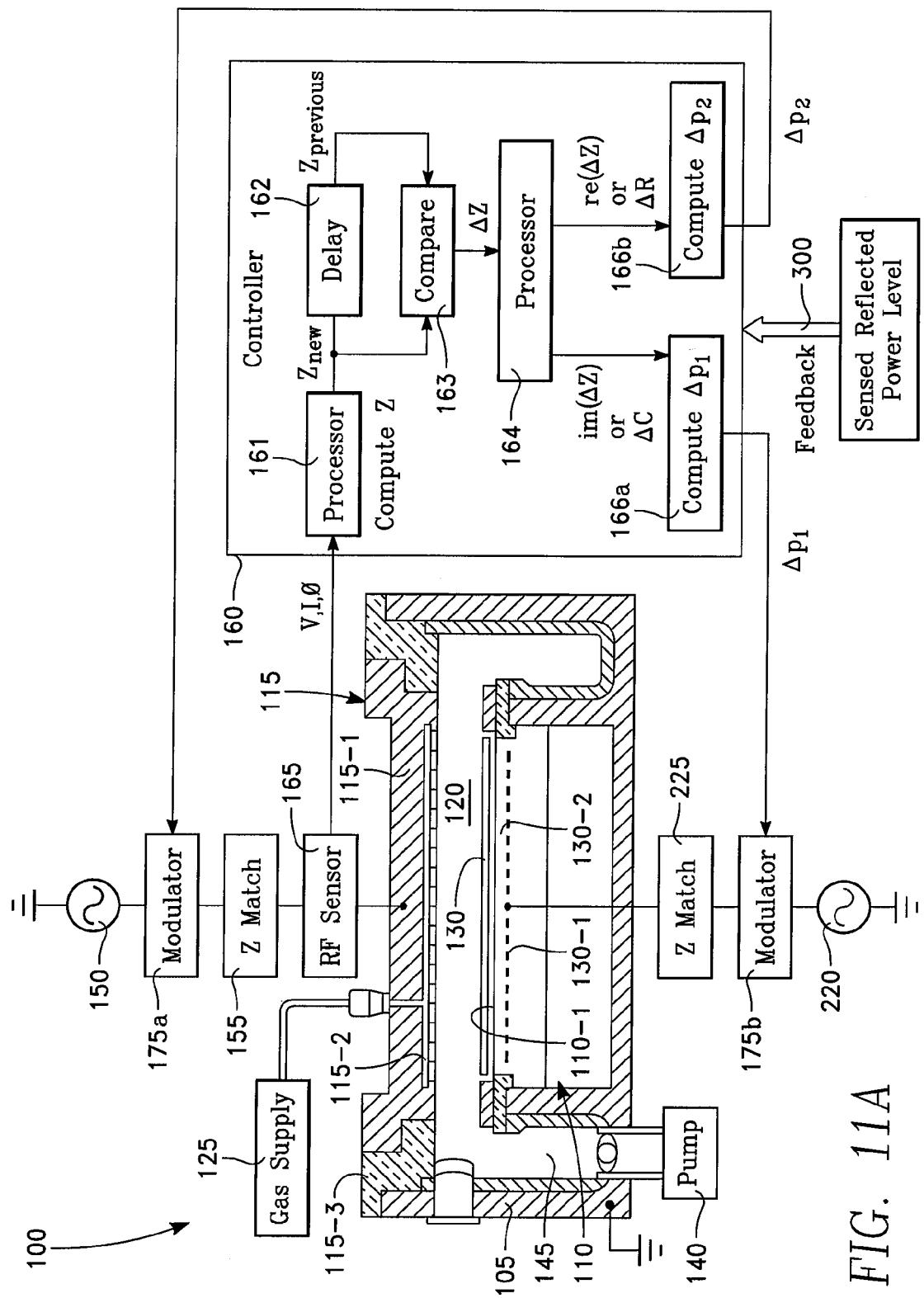
FIGS. 11A and 11B depict different embodiments in which stabilization RF power of different frequencies for stabilizing different components of the plasma impedance is obtained by modulating the RF plasma source power generator output and the RF plasma bias power generator output.

FIG. 11A depicts a modification of the reactor of FIG. 10A, in which the plasma impedance is measured at the source power generator 150 and match 155 is stabilized without providing a separate stabilization RF power generators. Instead, one or both of the source and bias power generators 150, 220 are modulated to provide power stabilization of the plasma impedance. The load impedance is sensed at the source generator 150 by locating the RF sensor 165 with the source impedance match 155. The modulator 175a is located at the output of the source power generator 150 and receives the VHF power change command from the controller 160. The modulator 175b is located at the output of the bias power generator 220 and receives the LF power change command from the controller 160. Instead, stabilization is attained by the controller 160 modulating the VHF source power generator 150. Modulation imposed by the modulators 175a, 175b may entail a low degree (e.g., 5%) of modulation and suffice to stabilize plasma impedance without unduly changing the process conditions.

Figure 11B:
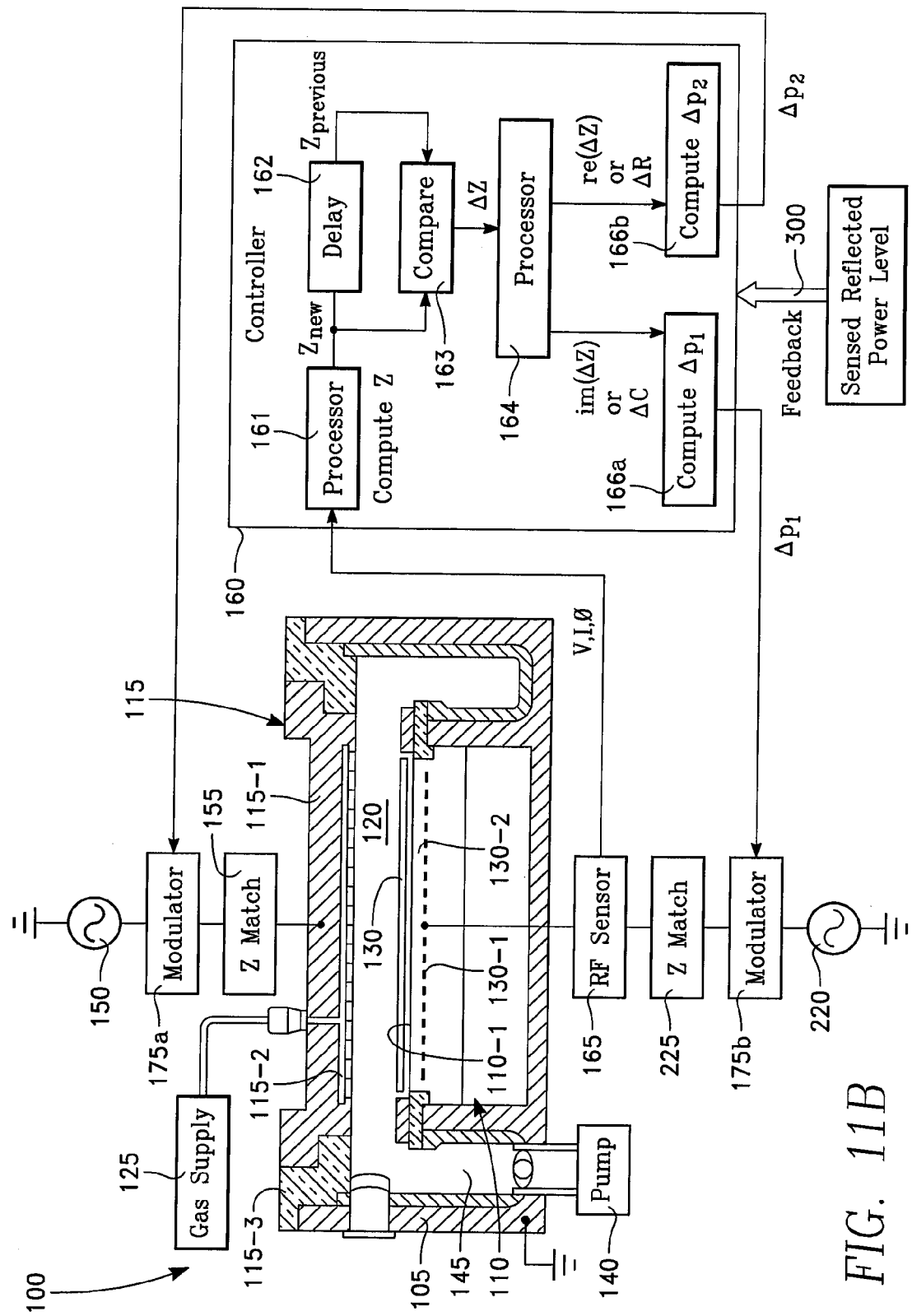

In the reactor of FIG. 11A, plasma load impedance is sensed at the RF source power generator 150 by locating the RF sensor with the RF source power match circuit 155. FIG. 11B depicts a modification of the reactor of FIG. 11A, in which plasma load impedance is sensed at the RF bias generator 220 rather than at the source power generator 150. The RF sensor 165 is located at the bias impedance match 225 in FIG. 11B.

Figure 12A:
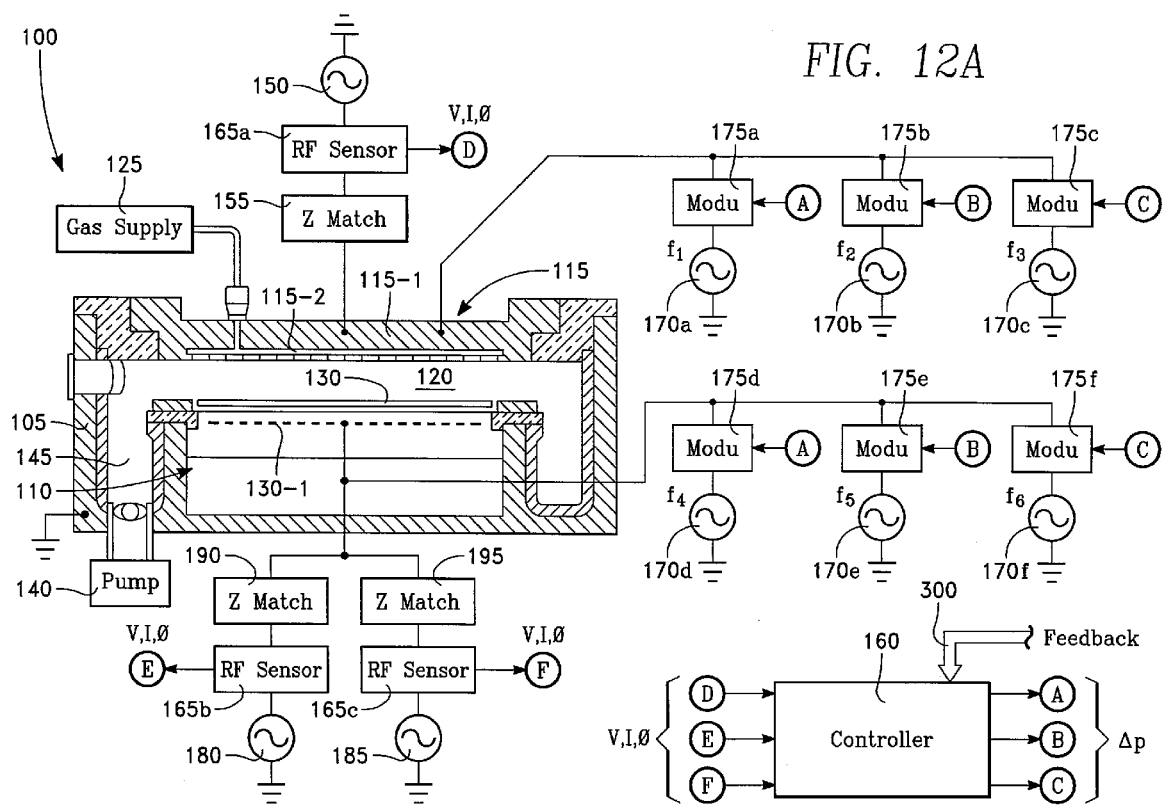
FIGS. 12A and 12B depict embodiments employing an array of plural stabilization RF power generators.

Various configurations of multiple independent stabilization RF power generators are possible. FIG. 12A depicts a plasma reactor having an array of stabilization generators 170a, 170b, 170c coupled through respective modulators 175a, 175b, 175c to the overhead electrode 115-1, and an array of stabilization generators 170d, 170e, 170f coupled to the wafer support electrode 130-1 through respective modulators 175d, 175e, 175f. The RF parameters required to determine plasma impedance, namely V, I and Ø, are sensed at the output of any one (or more) of the source and bias power generators 150, 180, 185, by respective RF sensors 165a, 165b, 165c that produce respective outputs labeled D, E and F. The controller 160 may produce one or more of plural control signals labeled A, B and C, in the manner previously described with reference to methods or processes of FIG. 2 or 4. Control signal A controls the outputs of the stabilization generators 170a, 170d, if activated, whose frequencies are selected to effectively compensate for transients in the VHF power. Control signal B controls the outputs of the stabilization generators 170b, 170e, if activated, whose frequencies are selected to effectively compensate for transients in the HF bias power. Control signal C controls the outputs of the stabilization generators 170c, 170f, if activated, whose frequencies are selected to effectively compensate for transients in the LF bias power.

Figure 12B:
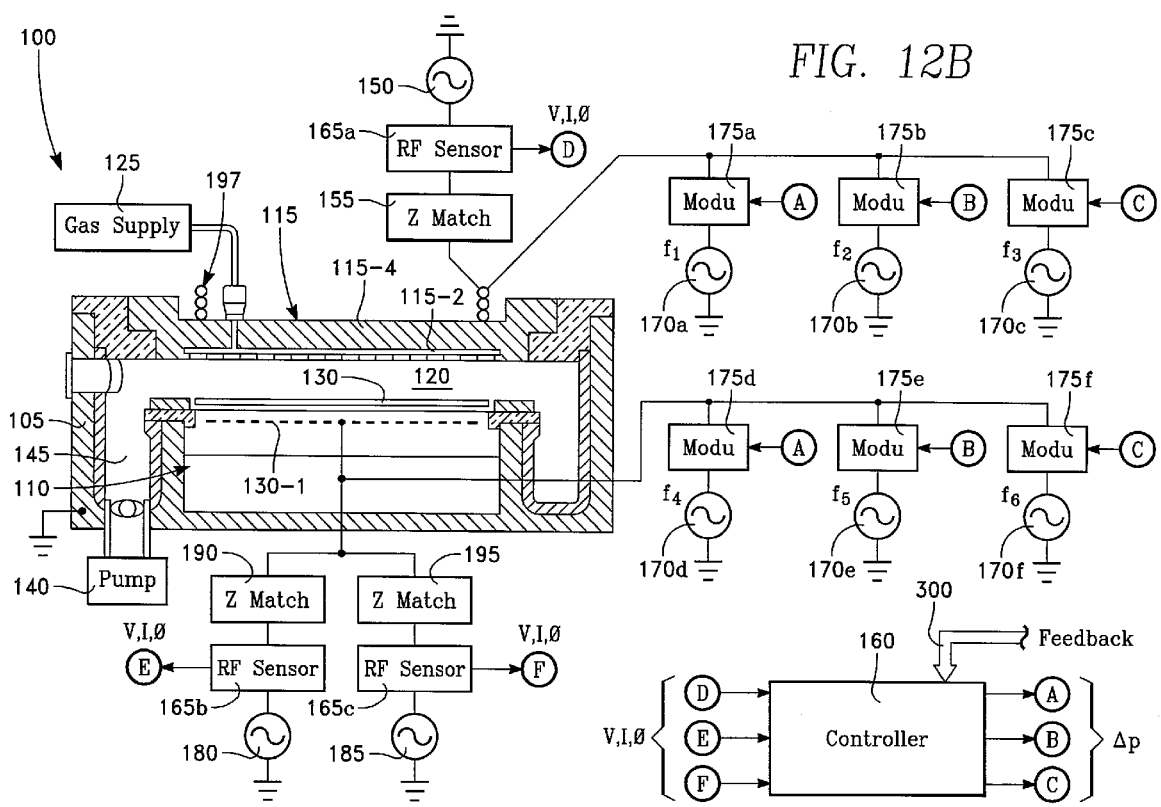

FIG. 12B depicts a modification of the reactor of FIG. 12A, in which the overhead electrode 115-1 is replaced by a dielectric ceiling 115-4, and an inductive coil antenna 197 overlying the ceiling 115 receives the RF source power from the generator 150 through the impedance match 155. The plasma is generated by inductive coupling, in which case the frequency of the source power generator 150 may be in the HF or LF range rather than VHF.

The modulation of the stabilization RF power may be controlled in real time to minimize reflected RF power sensed in real time at the source power generator (or at any bias power generator). For example, in FIG. 1, reflected RF power sensed at the source power generator 150 (using conventional techniques) relative to delivered (or total) RF power is furnished to the controller 160 as feedback signal. The controller 160 adjusts the degree of modulation of the stabilization power generator 170 (e.g., between 0% and 100% modulation) to minimize the reflected power. The controller 160 may be programmed with a trial-by-error algorithm performed over many processor cycles. In each processor cycle, the controller 160 determines whether the reflected power has increased since the previous processor cycle, and meets an increase in reflected power during the subsequent processor cycles by determining whether an increase or decrease in modulation of the stabilization generator output decreases the sensed reflected power during the next processor cycle. A successful trial leads the processor 160 to repeat whatever action preceded that success, i.e., either an increase or decrease in degree of modulation. The various embodiments illustrated in the drawings discussed above are illustrated as having the feature of the feedback input 300 of sensed reflected power from the source power generator 150 and/or from a bias power generator 180 or 185.

Figure 13:
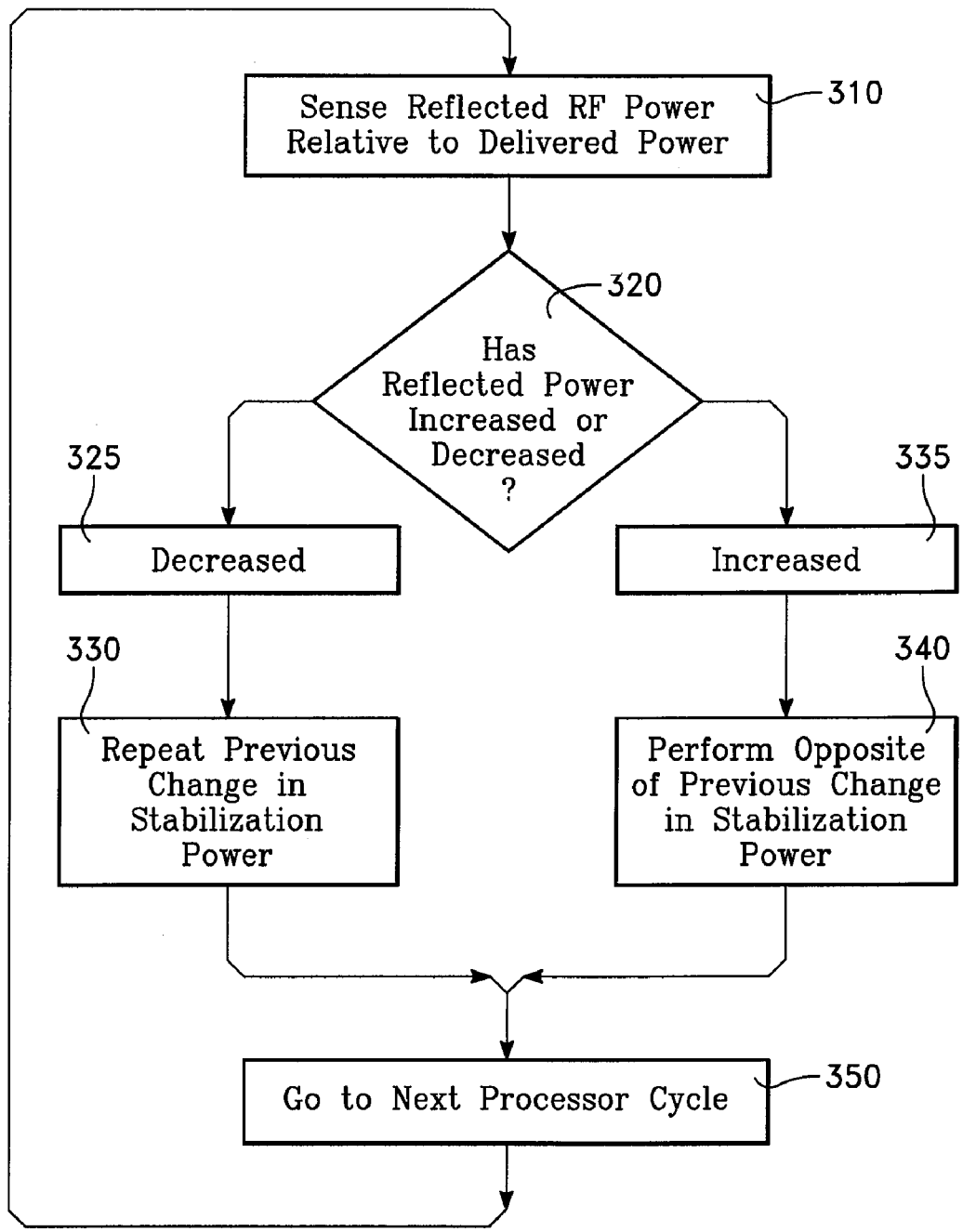
FIG. 13 depicts the operation of an optional reflected power feedback control loop in the foregoing embodiments.

One example of the operation of such a feedback loop by the controller 160 is depicted in FIG. 13 during a single processor cycle which is one of a succession of processor cycles. The first step (block 310) is to sense the reflected RF power at the source power generator 150 or bias power generator (180 or 190) of interest. The controller 160 then determines whether the reflected RF power has decreased or increased since the last processor cycle (block 320 of FIG. 13). If it has decreased (block 325), the prior change (if any) made to the stabilization power modulation (either a decrease or an increase in modulation percentage) is repeated (block 330). Such a change is a predetermined shift in the modulation percentage (e.g., by ±1%). Otherwise, if the reflected power has increased (block 335), the prior change made is reversed (block 340). This completes the current processor cycle, and the controller goes to the next processor cycle (block 350) and repeats the foregoing.

While the foregoing is directed to embodiments of the present invention, other and further embodiments of the invention may be devised without departing from the basic scope thereof, and the scope thereof is determined by the claims that follow.

What is claimed is:

1. A plasma reactor including a chamber for processing a workpiece, comprising:
   plural impedance matches and plural radio frequency (RF) plasma power generators coupled to deliver respective RF plasma powers into said chamber through respective ones of said impedance matches;
   a first stabilization RF power generator operatively connected to deliver RF stabilization power of a first frequency into said chamber;
   a controller programmed to:
      (a) determine changes in load impedance from RF parameters sensed at one of said generators and resolve said changes in load impedance into different components thereof; and
      (b) change the output power delivered by said first stabilization RF power generator into said chamber in response to a first component of said changes in load impedance.

2. The reactor of claim 1 further comprising a workpiece support electrode in said chamber and wherein said first stabilization power generator is coupled to said support electrode.

3. The reactor of claim 1 wherein said stabilization RF power generator is coupled to deliver RF power without an impedance match element at its output.

4. The reactor of claim 1 wherein:
   one of said generators provides a signal representing a measured level of RF power reflected back to the generator, said signal being coupled to said controller;
   said controller being programmed to adjust the level of said stabilization RF power generator to minimize said measured level of RE power reflected back to said generator.

5. The reactor of claim 1 wherein said reactor comprises a ceiling electrode, and wherein said first stabilization RF power generator is coupled to said ceiling electrode.

6. The reactor of claim 1 further comprising a plasma source power applicator, one of said plural RF plasma power generators being coupled to said plasma source power applicator through the corresponding impedance match, wherein said first stabilization power generator is coupled to said plasma source power applicator.

7. The reactor of claim 6 wherein said source power applicator comprises an electrode in said ceiling.

8. The reactor of claim 6 wherein said source power applicator comprises an inductive coil antenna overlying said ceiling.

9. The reactor of claim 1 further comprising:
   a second stabilization RF power generator operatively connected to deliver RF stabilization power of a second frequency into said chamber;
   wherein said controller is further programmed to:
      (c) change the output power delivered by said second stabilization RF power generator into said chamber in response to a second component of said changes in load impedance.

10. The reactor of claim 9 wherein:
said first component is a reactive component and said first frequency is in a low frequency range or below;
said second component is a resistive component and said second frequency is in or above a high frequency range.

11. The reactor of claim 9 wherein said reactor comprises a workpiece support electrode in said chamber and an RF plasma source power applicator, and wherein said second stabilization RF power generator is coupled to one of: (a) said support electrode, (b) said RF plasma source power applicator.

12. The reactor of claim 9 further comprising first and second modulators at outputs of said first and second stabilization RF power generators, respectively, said modulators being responsive to said controller.

13. The reactor of claim 12 wherein said chamber comprises a ceiling electrode, and wherein said first stabilization power generator is coupled through said first modulator to said ceiling electrode.

14. A plasma reactor including a chamber for processing a workpiece, comprising:
a radio frequency (RF) impedance match and an RF plasma power generator coupled to deliver RF plasma power into said chamber through said RF impedance match;
a first stabilization RF power generator operatively connected to deliver RF stabilization power into said chamber, and a first modulator coupled to modulate the output of said first stabilization RE power generator;
a controller programmed to:
  (a) determine changes in load impedance from RF parameters sensed at said impedance match and resolve said changes in load impedance into first and second components thereof; and
  (b) change the output power delivered by said first stabilization RF power generator into said chamber as a function of the first component of said changes in load impedance.

15. The reactor of claim 14 further comprising:
a second stabilization RF power generator operatively connected to deliver RF stabilization power into said chamber, and a second modulator coupled to modulate the output of said stabilization RF power generator;
wherein said controller is further programmed to:
  (c) change the output power delivered by said second stabilization RF power generator into said chamber as a function of the second component of said changes in load impedance.

16. The reactor of claim 15 wherein:
said first component is a reactive component and said first frequency is in a low frequency range or below whereby a majority of said first stabilization RF power affects plasma capacitance;
said second component is a resistive component and said second frequency is in or above a high frequency range.

17. A plasma reactor including a chamber for processing a workpiece, comprising:
a radio frequency (RF) impedance match and an RF plasma power generator coupled to deliver RF plasma power into said chamber through said RF impedance match;
an array of stabilization RF power generators operatively connected to deliver RF stabilization power of different respective frequencies into said chamber, and an array of modulators coupled to modulate the outputs of respective ones of said stabilization RF power generators;
a controller programmed to:
  (a) determine changes in load impedance from RF parameters sensed at said impedance match and resolve said changes in load impedance into plural components of said changes in load impedance; and
  (b) make respective changes by the respective ones of said modulators in the output power delivered by respective ones of said stabilization RF power generators into said chamber as a function of respective ones of said plural components of said changes in load impedance.

18. The reactor of claim 17 wherein:
said different respective frequencies affect said respective ones of said plural components of said changes in load impedance.

* * * * *